US010434756B2

(12) United States Patent
Rummens

(10) Patent No.: US 10,434,756 B2
(45) Date of Patent: Oct. 8, 2019

(54) PHOTOVOLTAIC MODULES WITH POLYPROPYLENE BASED BACKSHEET

(76) Inventor: Francois Rummens, Brussels (BE)

( * ) Notice: Subject to any disclaimer, the term of this patent is extended or adjusted under 35 U.S.C. 154(b) by 959 days.

(21) Appl. No.: 13/383,730

(22) PCT Filed: Jul. 16, 2010

(86) PCT No.: PCT/EP2010/004335
§ 371 (c)(1),
(2), (4) Date: Jan. 20, 2012

(87) PCT Pub. No.: WO2011/009568
PCT Pub. Date: Jan. 27, 2011

(65) Prior Publication Data
US 2012/0111407 A1 May 10, 2012

(30) Foreign Application Priority Data

Jul. 23, 2009 (EP) .................................. 09009543
Dec. 18, 2009 (EP) .................................. 09015706

(51) Int. Cl.
*B32B 27/32* (2006.01)
*B32B 17/10* (2006.01)
(Continued)

(52) U.S. Cl.
CPC ............... *B32B 27/32* (2013.01); *B32B 7/10* (2013.01); *B32B 7/12* (2013.01); *B32B 15/08* (2013.01);
(Continued)

(58) Field of Classification Search
CPC ............... H01L 31/048; H01L 31/049; H01L 2224/743; H01L 31/0481; B32B 2457/12
(Continued)

(56) References Cited

U.S. PATENT DOCUMENTS 4,103,674 A      8/1978  Robinson, Jr. et al.
4,477,523 A  *  10/1984  Biggs et al. .................. 428/389
(Continued)

FOREIGN PATENT DOCUMENTS

CN        101065438 A     10/2007
CN        101087842 A     12/2007
(Continued)

OTHER PUBLICATIONS

International Preliminary Report on Patentability, PCT/EP2010/004335, dated Dec. 12, 2011, 13 pgs.
(Continued)

*Primary Examiner* — Andrew J Golden
(74) *Attorney, Agent, or Firm* — Paul D. Strain, Esq.; Strain & Strain PLLC

(57) ABSTRACT

The present invention relates to photovoltaic modules backsheets (10) on base of preferably high molecular weight, impact resistant, shrinkage and thermal (flow) resistant FPP (Flexible Polypropylene) compositions preferably containing functional particles or being coextruded with a primer adhesive layer (13*a*) to obtain highly reliable adhesion on EVA adhesive layers (5). In one embodiment, the backsheet (10) has a functional PO adhesive layer (13*b*) allowing direct adhesion to cells back-contacts, i.e. without the use of an EVA adhesive layer (5). In a further embodiment, the backsheet (10), with functional PO adhesive layer (13*b*), allows the use of an upper adhesive layer (2) which is a surface functionalized transparent TPO film.

49 Claims, 7 Drawing Sheets

Figure 1:
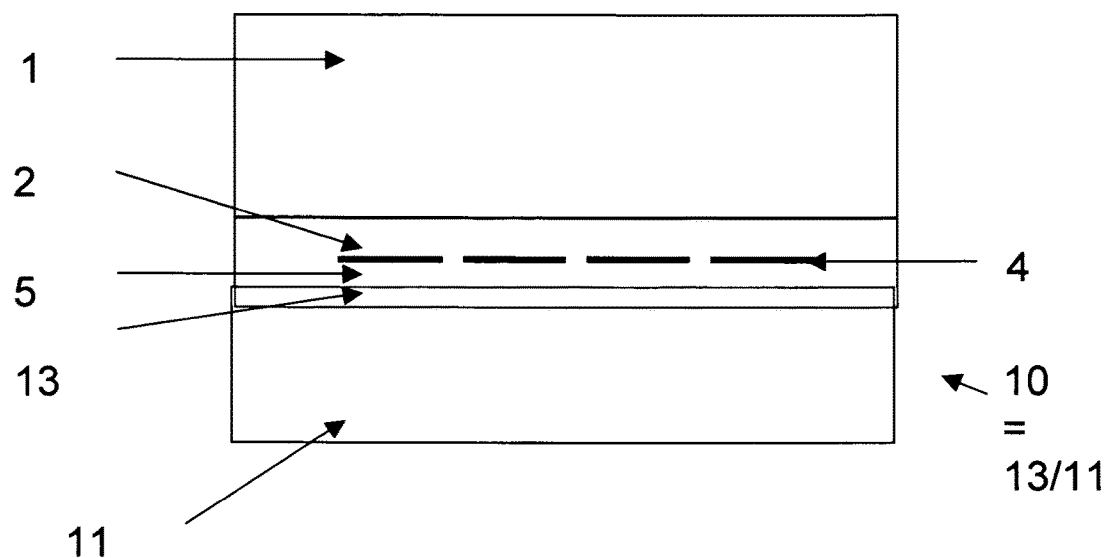

(51) Int. Cl.
*H01L 31/049* (2014.01)
*B32B 7/10* (2006.01)
*B32B 7/12* (2006.01)
*B32B 15/08* (2006.01)
*B32B 27/08* (2006.01)
*B32B 27/16* (2006.01)
*B32B 27/18* (2006.01)
*B32B 27/30* (2006.01)
*B32B 27/34* (2006.01)
*B32B 27/36* (2006.01)

(52) U.S. Cl.
CPC ........ *B32B 17/10788* (2013.01); *B32B 27/08* (2013.01); *B32B 27/16* (2013.01); *B32B 27/18* (2013.01); *B32B 27/304* (2013.01); *B32B 27/306* (2013.01); *B32B 27/308* (2013.01); *B32B 27/322* (2013.01); *B32B 27/34* (2013.01); *B32B 27/36* (2013.01); *H01L 31/049* (2014.12); *B32B 2255/10* (2013.01); *B32B 2255/20* (2013.01); *B32B 2255/205* (2013.01); *B32B 2262/101* (2013.01); *B32B 2264/101* (2013.01); *B32B 2270/00* (2013.01); *B32B 2307/206* (2013.01); *B32B 2307/306* (2013.01); *B32B 2307/308* (2013.01); *B32B 2307/3065* (2013.01); *B32B 2307/416* (2013.01); *B32B 2307/50* (2013.01); *B32B 2307/546* (2013.01); *B32B 2307/71* (2013.01); *B32B 2307/7246* (2013.01); *B32B 2307/734* (2013.01); *B32B 2457/12* (2013.01); *Y02E 10/50* (2013.01); *Y10T 428/24942* (2015.01); *Y10T 428/254* (2015.01); *Y10T 428/31913* (2015.04)

(58) Field of Classification Search
USPC .................................................. 136/243–265
See application file for complete search history.

(56) References Cited

U.S. PATENT DOCUMENTS

| | | | |
|---|---|---|---|
| 4,631,887 A | 12/1986 | Francovitch | |
| 5,310,141 A | 5/1994 | Homer et al. | |
| 5,409,549 A | 4/1995 | Mori | |
| 5,476,553 A * | 12/1995 | Hanoka et al. | 136/251 |
| 5,505,788 A | 4/1996 | Dinwoodie | |
| 5,986,203 A | 11/1999 | Hanoka et al. | |
| 6,065,255 A | 5/2000 | Stern et al. | |
| 6,105,317 A | 8/2000 | Tomiuchi et al. | |
| 6,184,057 B1 | 2/2001 | Van Andel et al. | |
| 6,331,673 B1 | 12/2001 | Kataoya et al. | |
| 6,437,235 B1 | 8/2002 | Komori et al. | |
| 6,729,081 B2 | 5/2004 | Nath et al. | |
| 6,809,251 B2 | 10/2004 | Dinwoodie | |
| 7,102,074 B2 | 9/2006 | Yen et al. | |
| 7,259,030 B2 | 8/2007 | Daniels et al. | |
| 7,276,658 B2 | 10/2007 | Dubbeldam | |
| 7,299,591 B2 | 11/2007 | Broatch | |
| 7,303,788 B2 | 12/2007 | Kataoka et al. | |
| 7,587,864 B2 | 9/2009 | Mccaskill et al. | |
| 7,618,310 B2 | 11/2009 | Daniels | |
| 7,638,007 B2 | 12/2009 | Sehanobish et al. | |
| 7,723,733 B2 | 5/2010 | Daniels et al. | |
| 7,773,064 B2 | 8/2010 | Doane et al. | |
| 7,796,103 B2 | 9/2010 | Doane et al. | |
| 7,810,286 B2 | 10/2010 | Eiffert et al. | |
| 7,814,899 B1 | 10/2010 | Port | |
| 7,863,760 B2 | 1/2011 | Daniels et al. | |
| 7,921,843 B1 | 4/2011 | Rawlings | |
| 7,971,398 B2 | 7/2011 | Tweedie | |
| 7,982,126 B2 | 7/2011 | Macfarlane | |
| 8,158,450 B1 | 4/2012 | Sheats et al. | |
| 8,197,928 B2 | 6/2012 | Volpp et al. | |
| 8,318,316 B2 | 11/2012 | Muckenhuber | |
| 8,333,040 B2 | 12/2012 | Shiao et al. | |
| 8,438,796 B2 | 5/2013 | Shiao et al. | |
| 8,458,967 B2 | 6/2013 | Kalkanoglu et al. | |
| 2002/0050287 A1 | 5/2002 | Yamada et al. | |
| 2003/0034064 A1 | 2/2003 | Hatsukaiwa et al. | |
| 2005/0074623 A1 | 4/2005 | Vogel | |
| 2006/0151107 A1 | 7/2006 | Peterson | |
| 2006/0201544 A1 | 9/2006 | Inoue | |
| 2006/0260269 A1 | 11/2006 | Swiszcz et al. | |
| 2007/0000537 A1 | 1/2007 | Leidholm et al. | |
| 2007/0062573 A1 | 3/2007 | Ferri et al. | |
| 2008/0053512 A1* | 3/2008 | Kawashima | 136/244 |
| 2008/0178928 A1* | 7/2008 | Warfield et al. | 136/251 |
| 2009/0165847 A1* | 7/2009 | Mori et al. | 136/256 |
| 2010/0108128 A1* | 5/2010 | Chu | H01L 31/049 136/252 |
| 2010/0200061 A1 | 8/2010 | Melchior | |
| 2010/0224235 A1 | 9/2010 | Takagi et al. | |
| 2011/0017278 A1 | 1/2011 | Kalkanoglu et al. | |
| 2011/0041429 A1 | 2/2011 | Rummens et al. | |
| 2012/0208033 A1 | 8/2012 | Weigel et al. | |
| 2013/0032191 A1 | 2/2013 | Rummens | |
| 2014/0060645 A1 | 3/2014 | Rummens | |

FOREIGN PATENT DOCUMENTS

| | | |
|---|---|---|
| CN | 101313046 A | 11/2008 |
| DE | 198 40 076 A1 | 3/2000 |
| DE | 298 24 045 U1 | 3/2000 |
| DE | 10 2006 022 455 A1 | 11/2007 |
| DE | 20 2008 000 237 U1 | 5/2008 |
| EP | 0 769 818 A2 | 4/1997 |
| EP | 0 905 795 A2 | 3/1999 |
| EP | 0 949 686 A1 | 10/1999 |
| EP | 1 443 158 A | 8/2004 |
| EP | 1 777 357 A1 | 4/2007 |
| EP | 1 898 470 A1 | 3/2008 |
| EP | 9 009 543 | 7/2009 |
| EP | 2 086 019 A1 | 8/2009 |
| EP | 9 015 706 | 12/2009 |
| EP | 2 230 694 A2 | 9/2010 |
| EP | 2 277 693 A1 | 1/2011 |
| EP | 2 541 622 A2 | 1/2013 |
| EP | 2 245 674 B1 | 9/2013 |
| EP | 2 461 973 B1 | 12/2014 |
| GB | 2 438 526 A | 11/2007 |
| GB | 2 438 526 B | 5/2009 |
| JP | 2001-94135 A | 4/2001 |
| JP | 2008-14038 A | 1/2008 |
| WO | WO 98/13882 A1 | 4/1998 |
| WO | WO 99/04971 A2 | 2/1999 |
| WO | WO 01/35898 A1 | 5/2001 |
| WO | WO 2004/066324 A2 | 8/2004 |
| WO | WO 2006/089044 A2 | 8/2006 |
| WO | WO 2008/101792 A2 | 8/2008 |
| WO | WO 2009/095273 A1 | 8/2009 |
| WO | WO 2010/053936 A1 | 5/2010 |
| WO | WO 2010/053936 A9 | 5/2010 |
| WO | WO 2011/009568 A1 | 1/2011 |

OTHER PUBLICATIONS

Chinese Office Action and English translation thereof, Appl. No. 201080032047.6, dated Dec. 10, 2013, 22 pgs.
International Search Report, PCT/EP2010/004335, dated Dec. 20, 2010, 2 pgs.
International Search Report, PCT/EP2009/000661, dated Jun. 4, 2009, 3 pgs.
Rummens, U.S. PTO Office Action, U.S. Appl. No. 12/865,694, dated Jan. 11, 2012, 15 pgs.
Rummens, U.S. PTO Office Action, U.S. Appl. No. 12/865,694, dated May 10, 2012, 15 pgs.
European Search Report, Appl. No. 12006740.0, dated Jun. 17, 2013, 5 pgs.
Rummens, U.S. PTO Notice of Allowance, U.S. Appl. No. 13/648,554, dated Jul. 18, 2013, 11 pgs.

(56) References Cited

OTHER PUBLICATIONS

Rummens, U.S. PTO Office Action, U.S. Appl. No. 13/648,554, dated Dec. 18, 2012, 14 pgs.
EPO communication of a notice of opposition, Appl. No. 09705933.1, dated Jun. 18, 2014, 8 pgs.
Rummens, U.S. PTO Corrected Notice of Allowance, U.S. Appl. No. 14/078,851, dated Aug. 19, 2014, 6 pgs.
Rummens, U.S. PTO Office Action, U.S. Appl. No. 14/078,851, dated Apr. 7, 2014, 10 pgs.
Rummens, U.S. PTO Office Action, U.S. Appl. No. 14/078,851, dated Dec. 16, 2013, 11 pgs.
Rummens, U.S. PTO Office Action, U.S. Appl. No. 14/078,851, dated Dec. 16, 2014, 17 pgs.
Rummens, U.S. PTO Notice of Allowance, U.S. Appl. No. 14/078,851, dated Apr. 23, 2015, 8 pgs.
Rummens, U.S. PTO Notice of Allowance, U.S. Appl. No. 14/078,851, dated Aug. 8, 2014, 8 pgs.
DSM Intellectual Property, Opposition against EP 2 277 694 B1, dated Jun. 11, 2018, 15 pgs.
Borealis AG, Opposition against EP 2 277 694 B1, dated Jun. 8, 2018, 50 pgs.
Hung et al., "Adhesion, Permeability, and Mechanical Properties of Multilayered Blown Films Using Maleated Low-Density Polyethylene Blends as Adhesion-Promoting Layers", Polymer Journal, vol. 35, No. 12 (2003), pp. 978-984.
WYPYCH, Handbook of Polymers / George Wypych—Second Edition, Published by ChemTec Publishing, Toronto, Ontario, Canada (2016), 2 pgs.
Properties of MODIC L502, Mitsubishi Chemical Performance Polymers. Inc, Product Data Sheets, available at: http://www.mcc-spd.com, visited Feb. 2018, 3 pgs.

\* cited by examiner

DSC Hifax CA 10 A

DSC Hifax CA 12 A 6003   1   2   4   10   6002

PHOTOVOLTAIC MODULES WITH POLYPROPYLENE BASED BACKSHEET

CROSS-REFERENCE TO RELATED PATENT APPLICATIONS

This application is a National Stage of International Application No. PCT/EP2010/004335, filed Jul. 16, 2010, which is based upon and claims the benefit of priority from prior European Patent Applications No. 09015706.6, filed Dec. 18, 2009, and Ser. No. 09/009,543.1, filed Jul. 23, 2009, the entire contents of all of which are incorporated herein by reference in their entirety.

The present invention relates to a polypropylene based backsheet which combines low lateral flow and excellent release properties preferably for use in photovoltaic modules.

A photovoltaic module (also abbreviated PV module) comprises at least the following layers: a top layer, an active layer consisting of a photovoltaic material layer sandwiched between a front and a back electrode layer and an electrically insulating backsheet. Usually the top layer is connected with the active layer via an upper adhesive layer. In many cases the active layer is connected with the backsheet via a back adhesive layer. These layers can be attached to a substrate like a metal sheet or rigid plastic sheet, or protected by a e.g. scratch resistant protective layer or provided with yet another adhesive layer for connection to a junction box or mounting surface. Each of the layers could be comprised of two or more sublayers. Barrier layers can be included, especially into the active layer.

The top layer is typically either a glass plate or, especially for flexible modules, a layer from fluorinated polymers like ETFE (ethylen tetrafluorethylene) or PVDF (polyvinylidene fluoride). Generally a transparent upper adhesive layer is present between the top layer and the active layer, most usually this upper adhesive layer is based on EVA (ethylene vinyl acetate), e.g. on crosslinked EVA like Vistasolar 486.10 (from Etimex). It is generally accepted that the EVA benefits from containing a glass fleece or glass fibres or glass beads.

For the active layer a multitude of photovoltaic materials is known, e.g. a-Si cells, tandem cells (a-Si, a-Si or a-Si, microcrystalline silicon, . . . ), triple junction a-Si/a-SiGe/a-SiGe, Organic PhotoVoltaic (OPV), CIGS, etc. which can also be provided in multi layer form. In case of a glass top layer the active layer is often directly attached to the top layer. In flexible modules, the active layer is built on a flexible supporting film (plastic or metallic).

The back electrode is generally a metallic layer, like aluminium layer and the front electrode a transparent conductive oxide layer.

Beneath the active layer an insulating backsheet is necessary and typically connected to the active layer via a back adhesive layer from crosslinkable EVA. Crosslinkable EVA contains peroxides and often also silanes. According to the prior art a so called TPT (Tedlar/PET/Tedlar) film is very common as backsheet, which consists of the following layers, laminated with the help of supplementary adhesives:

A polyvinylfluoride (e.g. Tedlar®) film, Corona or flame treated on both sides (25 to 40 μm thick)
a bi-component solvent based polyurethane (PUR) adhesive layer (5 to 10 μm)
a polyethyleneterephtalate (PET) film (typically 250 μm thick)
a bi-component solvent based PUR adhesive layer (5 to 10 μm thick)
A polyvinylfluoride (e.g. Tedlar®) film, Corona or flame treated on both sides (25 to 40 μm thick)

Such TPT foil is suitable as backsheet because of its unique combination of useful properties like electrical insulation, no or low UV aging, dimensional stability at module lamination temperature (150° C.), excellent adhesion to EVA adhesive films, at least if surface treated, and to sealants and limited water vapor permeability. Such TPT foil has several drawbacks. It is very expensive to produce as each layer must first be produced and laminated afterwards with supplementary solvent based glues. It consists of halogenated material (Tedlar®) and hydrolysis sensitive materials (PET, PUR adhesives), which is a severe drawback for hot, humid, sunny climates. Thus, there exists a need for less costly materials that provide the same useful properties.

State of the art crosslinkable EVA adhesive are 0.460 mm thick film and made on base of EVA with around 30% Vinyl Acetate. They contain peroxides and possibly silane adhesion promoters, UV absorbers, anti-oxydants and HALS light stabilizers. Useful EVA films formulation are e.g. described in WO 99/27588. They are well established as durable highly transparent adhesive layers. They are very useful to encapsulate thick crystalline Si PV cells (typically 250 μm) thanks to their ability to flow around the cells. But such adhesive films have an expensive composition and are difficult to produce. Their crosslinking occurs typically at around 145-150° C., typically during 15 minutes. Such curing process is delicate to control (bubbles generation during lamination/curing) and unacceptable shrinkage of the adhesive may occur, with undesired displacement of the PV cells.

Thus, there exists a need for replacement of such EVA adhesive layer, especially for back adhesive application.

Pending not prior published EP 08001991 mentions as background information a TPO Hifax CA 10 A based layer which is laminated to PV cells with the help of an EVA back-adhesive layer. Such combination is not ideal as the adhesion between the EVA adhesive layer and the TPO Hifax CA 10 based layer is difficult to control and may become poor after some storage of the TPO Hifax CA 10 based backsheet. Unpleasant flow/deformation of the TPO Hifax CA 10 based backsheet is observed at 150° C.

The same application provides in its third embodiment a backsheet being a "TPO/TPO intermediate layer 1/TPO intermediate layer 2/Tie-layer", where the TPO is based on Hifax CA 10 (possibly with modifiers to improve adhesion), the TPO intermediate layer 1 is based on a "compatibilizing resin blend" between Hifax CA 10 A and layer 2, the TPO intermediate layer 2 is based on VLDPE and the tie-layer is based on EAA (copolymer of ethylene with acrylic acid). Such system replaces the EVA back adhesive layer. An EVA upper adhesive layer is still used, with the known process related difficulties. Unpleasant flow is also observed at lamination temperature of 150° C.

It also provides an EVA upper adhesive layer replacement in the form of a tie-layer/TPO/tie-layer. The application fails to disclose specific compositions with high light transmission and good flow properties in combination with a backsheet, especially in relation with crystalline silicon cells needing a controlled adhesive layer lateral flow in order to avoid the cells moving unacceptably, and technology allowing for excellent adhesion to front glass at least at moderate temperature of 150° C. or less.

In conclusion, there is still a need of a cost effective backsheet composition with improved release properties, flow and dimensional stability. Such backsheet should have excellent adhesion to EVA.

Possibly, such backsheet should be integrated with a back-adhesive layer to replace EVA back-adhesive layer, preferably in combination with a non EVA upper adhesive, both capable of encapsulating thick crystalline PV cells. There is therefore still the need of an effective combination of adhesive integrated backsheet and a transparent tie-layer/TPO/tie-layer with high light transmission, both providing controlled lateral flow and adequate encapsulation properties and excellent adhesion to classical crystalline Si cells and front glass at lamination temperature of preferably 150° C. or less.

Further approaches to replace the adhesive layers and/or backsheet are found e.g. in EP 1 898 470 and WO 99/04971. In EP 1 898 470 the backsheet comprises a barrier layer from an inorganic oxide vapour deposited onto a film, otherwise the known films based on PEN or PET are recommended.

WO 99/04971 uses a three layer encapsulant as adhesive comprising a LLDPE layer sandwiched between ionomer layers. The backsheet is a Tedlar laminate or glass or a thermoplastic material. The thermoplastic material proposed is a thermoplastic polyolefin mixed with at least two acid copolymers.

SUMMARY OF THE INVENTION

The object of the invention is in a first embodiment solved by providing a multi-layer coextruded or colaminated backsheet wherein its layer facing the active layer is based on a flexible polypropylene (FPP) blend having a residual heat of fusion, i.e. a heat of fusion between lamination temperature and end of fusion, of less than 30 J/g, preferably less than 5 J/g, most preferably is totally melted, and where the further layer(s) is (are) also FPP based layers. The layer of the backsheet at the opposite side of the active layer, also designated main layer, is preferably based on a FPP which has a higher melting temperature than the module lamination temperature (typically 150° C.). Preferably such layer is based on a FPP blend with a residual heat of fusion at lamination temperature of at least 10 J/g, preferably at least 20 J/g. If required one or more middle layer(s), designed as "compatibilizing" layer(s), have adapted compositions to obtain good adhesion between the layers of the backsheet and good extrusion rheology. To improve resistance to peroxide cracking, the FPP are preferably of low Melt Flow Rate (MFR).

The total thickness of the backsheet is typically 0.5 mm, with its layer facing the active layer typically less than 100 μm allowing the peroxides of the EVA adhesive layer to partly crosslink this layer and graft it with the main layer (improving adhesion).

Such backsheet shows a surprising combination of many useful properties: reliable adhesion with peroxide crosslinkable EVA back adhesive layer, barrier properties, enough dimensional stability, mechanical properties retention (integrity) and limited heat distortion (flow) at usual vacuum lamination process, excellent aging (a.o. no hydrolysis), excellent electrical properties (>1000 VDC partial discharge Voltage), excellent cold temperature mechanical properties and weldability to junction boxes.

The object is further solved by addition of functional particles in the material composition of the backsheet layer facing the active layer, that are able to control the coupling reactions triggered by the peroxides and/or silanes of the crosslinkable EVA back adhesive layer, leading therefore to improved mechanical properties of and more reliable adhesion between backsheet and crosslinkable EVA adhesive layer.

In one specific embodiment, the functional particles are specific halogenated fire retardant particles, which allows also achieving excellent external fire performances of PV modules integrated with waterproofing membranes.

In another embodiment, the object is solved by providing a multi-layer backsheet where the layer facing the active layer has intrinsic adhesion with EVA adhesive films and is based on polyethylene (PE), preferably "polar" polyethylene, i.e. ethylene copolymerized with polar comonomers chosen from vinyl acetate, acrylic and methacrylic ester (methylacrylate, ethylacrylate, butylacrylate, ethylhexylacrylate, . . . ), etc. Intrinsic adhesion means that such a layer has good adhesion on EVA adhesive layers even without the action of its peroxides, i.e. the polymers of the layers are chemically compatible (chemical affinity). Layers of the backsheet between the layer facing the active layer and the main layer are in this case based on PE and/or FPP and are compatibilizing or adhesive intermediate layers.

The object is further solved by providing an adhesive multi-layer backsheet integrating the back adhesive layer (tie-layer) and the backsheet with e.g. thermoplastic polyolefin (TPO) intermediate layers (compatibilizing or adhesive layers). The layer functioning as the back adhesive layer is able to develop its adhesion to the backside of PV cells or PV cells supporting films and also in order to provide effective encapsulation, to the PV module top layers (i.e. the upper adhesive layer if any or glass front layer with adequate surface treatment e.g. at the edges of the module, etc.) at moderate temperature of less than 150° C., even less than 140° C., and is based on functional polyethylene grafted or copolymerized with reactive groups, like acrylic acid, methacrylic acids, maleic anhydride (MAH), glycidyl methacrylate, hydroxyalkylacrylate and possibly copolymerized with polar comonomers chosen from vinyl acetate (VAc), acrylic ester (methylacrylate, ethylacrylate, butylacrylate, ethylhexylacrylate), etc.

Polyethylene MAH grafted and possibly copolymerized with VAc is preferred.

Further layers of the backsheet in this embodiment are compatibilizing layers with a melting temperature essentially under lamination process temperature, with adapted thickness, to allow enough polymer flow around the PV cells (crystalline Si types, . . . ), which is especially desired for thick crystalline Si PV cells (encapsulation), and a main backsheet layer based on a FPP blend with a residual heat of fusion (i.e. above lamination temperature) of at least 10 J/g, preferably at least 20 J/g.

The object is further solved by providing a transparent upper adhesive film, being an highly transparent lateral flow resistant tie-layer/TPO/tie-layer film. This is especially preferred in combination with the adhesive multi-layer backsheet integrating the back adhesive layer with the backsheet.

The tie-layer is similar to the tie-layer of the adhesive integrated backsheet and transparent. The TPO layer consist of crosslinked ethylene copolymer or is a TPO multi-layer consisting of mainly VLDPE based highly transparent resin layers and at least one thin internal layer consisting mainly of a RCP/VLDPE blend providing lateral flow resistance during lamination.

Further, interconnected e.g. crystalline Si PV cells are laminated at moderated temperature (<150° C.) with the backsheet integrating the back adhesive layer beneath and above, the transparent upper adhesive film and a transparent top layer, being e.g. a glass plate beforehand treated with amino-silanes, in a one step process to produce a PV module (framing/mounting elements, electrical connections and application of a junction box are not described and done in further steps).

DETAILED DESCRIPTION OF THE INVENTION

A typical crosslinkable EVA adhesive film containing peroxide crosslinkers and silane adhesion promoters is sold by Etimex under the trade name Vistasolar 486.10 (the base resin of such a film is an EVA with around 33% VAc like Elvax 150). The content of peroxide in the EVA adhesive layer can advantageously be increased to compensate for the loss by migration into the backsheet. This state of the art crosslinkable EVA adhesive films are not available with halogenated flame retardants, especially cost effective halogenated flame retardants like Saytex® 8010, because those are not compatible with their production process.

A useful TPO for the backsheet or as layer of the backsheet or as layer of a back or upper adhesive layer (tie-layer/TPO, or tie-layer/TPO/tie-layer instead of EVA), can be based on the following polymers or blends thereof:
  flexible polypropylene (FPP) mechanical or reactor blends of PP resins (homo or copolymer) with EPR rubber (ethylene propylene rubber), like Hifax CA 10 A, Hifax CA 12, Hifax CA7441A, supplied by LyondellBasell,
  mechanical FPP blends of PP resins with elastomer PP resins (like supplied by Dow under the trade name Versify 2300.01 or 2400.01),
  mechanical FPP blends of PP (preferably random copolymer of propylene (RCP) with ethylene and possibly other olefins) with LLDPE (linear low density polyethylene) or VLDPE (very low density polyethylene) plastomers (like Exact 0201 or Exact 8201 supplied by Dexplastomers),
  polymerization FPP blends of PP blocks with PE blocks,
  olefin block copolymers (OBC) resins of crystalline PE parts (blocks) and amorphous copolymerized PE parts (blocks) providing softness and high DSC melting temperature (±120° C.), like INFUSE™ olefin block copolymers supplied by Dow,
  polyethylene plastomers (VLDPE) or LLDPE, i.e. PE obtained by copolymerization of ethylene with short-chain alpha-olefins (for example, 1-butene, 1-hexene and 1-octene), with a density of less than 925 kg/m$^3$ (ISO 1183), possibly (partially) crosslinked to improve heat distortion temperature and flow during lamination of PV modules and possibly with addition of softener resin, like SEBS (e.g. Kraton G1657), EPR resin, EPDM resin, etc.
  copolymer of ethylene with polar comonomers chosen from vinyl acetate, acrylic ester (methylacrylate, ethylacrylate, butylacrylate, ethylhexylacrylate, gycidyl methacrylate), acrylic acid, methacrylic acids, maleic anhydride (MAH), possibly grafted, ionomers, etc.
  thermoplastic vulcanisates blends based on blends of PP or PE with EPDM rubber, like Santoprene base blends, blends with PP are an FPP.

It has been found that to limit the heat distortion (shrinkage, flow, excessive adhesion to the straps of vacuum laminators, mechanical damage during release from the press, etc.) during PV module lamination that typically takes place at around 150° C. FPP based layers are required as main layer of the backsheet. To maintain mechanical integrity of the backsheet, such FPP should have a residual heat of fusion of at least 10 J/g, preferably at least 20 J/g (see DSC analysis—FIG. 8).

It is preferred to use resins with significantly higher (5° C.) melting temperature than the module lamination temperature (see DSC analysis—FIG. 8 and MTM 15902), an interesting candidate should be homopolymer PP.

It has been found that homopolymer PP based layers have poor adhesion (bubbles formation and/or adherence of less than 20 N/cm—EN12316-2) to crosslinkable (peroxide) EVA adhesive layers at usual lamination temperature (typically 150° C.). To obtain good adhesion, it is required that such PP is blended with a high content of rubbery material (EPR) to form with it an interpenetrated network of PP and rubber. In this case, the PP becomes an FPP and films or foils thereof have a cold foldability (according to EN 495/5) of at least −20° C., preferably of −40° C. or lower. Adhesion with crosslinkable (peroxide) EVA requires a high rubber content (>50%), meaning de facto a low residual heat of fusion.

It has been surprisingly found that random copolymers of PP based layers, with a resin residual heat of fusion preferably less than 5 J/g have good adhesion to crosslinkable (peroxide) EVA adhesive layers at lamination temperature (typically 150° C.). Addition of rubbery material or plastomers (EPR, VLDPE, . . . ) is in this case required to achieve low temperature impact resistance, softness at low temperature and better compatibility with peroxide curing. Such layers and backsheets made thereof should therefore have a cold foldability (according to EN 495/5) of at least −20° C., preferably of −40° C. or lower.

Such layers have of course poor dimensional stability at module lamination temperature.

Therefore a (preferably coextruded) multi-layer backsheet is provided according to the invention, wherein the layer facing the active layer has a low residual heat of fusion, preferably less than 5 J/g, most preferably is totally melted at module lamination temperature and where the rest of the layers are FPP based layers, where the main layer is based on a FPP which has preferably a higher melting temperature than the module lamination temperature (typically 150° C.), meaning a residual resin heat of fusion of at least 10 J/g, most preferably at least 20 J/g and where the preferred intermediate layer(s) are designed to be "compatibilizing" layers to obtain good adhesion between the layer facing the active layer and the main layer and good extrusion rheology.

When the layer facing the active layer is sufficiently thin (typically 100 μm or less), the peroxides of the EVA back-adhesive will migrate through it and improve adhesion between the main layer and this layer. Intermediate layers between the main layer and the layer facing the active layer, i.e. the one in contact with the EVA back-adhesive layer, are in this case not required.

To improve resistance to peroxide cracking and mechanical integrity at lamination temperature, FPP resins (blends) with a Melt Flow Rate (230° C./2.16 kg—ISO 1133, applies to all MFR in this text) of less than 10 g/10 min. are preferred (acceptable cracking reactions during 15 minutes at 150° C.). Addition of anti-oxidants and suitable chemicals (e.g. multi-acrylates like e.g. pentaerythritol triacrylate) to control PP chain scission is useful and well known by the man skilled in the art.

Functional particles, i.e. particles having chemical groups at their surface which are able to react with, control or catalyze the reaction of the peroxides and/or silanes of the crosslinkable EVA adhesive layers with the PP may be advantageously added to the composition of the layer(s) coming into contact with the EVA adhesive layer(s).

It has been found that when adding functional particles in the formulation of the layer facing the active layer, e.g. on base of Hifax CA 10 A, the adhesion with crosslinkable EVA films can be increased by typically 25% or more. The adhesion with crosslinkable EVA films remains excellent even after extensive storage of the layer.

Such functional particles are defined by the man skilled in the art by help of a few orienting tests and can e.g. be based on Al(OH)3 or Mg(OH)2 fire retardant particles or metal oxides, possibly coated at their surface with silanes such as Aminopropyltriethoxysilane (H2C3H6-Si(OC2H5)3), Gamma-Methacryloxypropyl trimethoxysilane, bis-structure (Z-6670 from Dow Corning), etc. or mixtures of these.

In a preferred embodiment functional particles with a fine particle size (typically from 1 to 10 μm) are used. Preferably the functional particles are based on ethylene bis tetrabromo phthalimide. Such particles provide improved adhesion with crosslinkable EVA adhesive layer as well as excellent aging and improved reaction to fire properties, when the layer is used as component of a PV integrated waterproofing membrane or as part of a tie-layer/TPO. A commercial example of such particle is Saytex BT 93 (preferably white grade).

The functional particles can in the case of a coextruded or colaminated film or foil preferably only be added into the layer which is laminated in contact with crosslinkable EVA adhesive film.

To obtain good adhesion between the layer facing the active layer and the main layer with preferably higher melting temperature, one may use one or several FPP based intermediate layers having adapted intermediate compositions between the compositions of the layer facing the active layer and the main layer. Such layers will gradually match the compositions and rheology of the layers to be brought together. Addition of plastomers (VLDPE) or elastomer PP resins (Versify type resins) helps compatibilization. They will not be detailed as such exercise is obvious for the man skilled in the art.

FPP layers don't stick "intrinsically" to crosslinkable EVA adhesive layer. The crosslinkable EVA adhesive layer, which contains peroxides and possibly silanes, leads conditionally to effective "grafting" reactions at the interface of the FPP backsheet with the crosslinkable EVA adhesive film and thus provides adhesion.

After extensive work, it has been found that the adhesion after lamination (typically 15 minutes 150° C.) between the FPP backsheet or electrical insulation layers on substrate with crosslinkable EVA films is dependent on many factors (residual quantity of Organoalkoxysilanes in the PP resin, residual acidity of the PP resin, production and/or storage in humid conditions, excessive peroxide cracking, exudation of anti-oxydants, oligomers, increase of FPP cristallinity during storage, . . . ) and may vary significantly to even drop to very low values of less than 20 N/cm, typically around 12 N/cm, which is typically the peeling value between a FPP backsheet (like a Hifax CA 10 A based) and an adhesive film based on EVA without peroxides and without silane. The addition of functional particles into the layer of the backsheet adjacent the back adhesive layer improves the reliability of the adhesion.

It has been found that an Elvax 150 based adhesive layer without peroxide or silane has good adhesion on polyethylene and "polar" polyethylene based layers. Such good adhesion is referred as "intrinsic adhesion", because acceptable adhesion (>30 N/cm) is already achieved even without the need of the complex chemistry of the migrating peroxides and silanes, at least at ambient temperature. As a result, the adhesion of such layer with crosslinkable EVA adhesive layers is more reliable. Such layer is called a primer layer and is a preferred embodiment of the layer facing the active layer.

The intrinsic adhesion with EVA adhesive film (33% VAc) of several compositions is reported in the following table. On base of these results and testing procedure, the man skilled in the art will easily define useful "primer" layers.

| Foil base resin: | Intrinsic adhesion with Elvax 150 |
| --- | --- |
| VLDPE (Exact 0201) or EVA (EVA 1010VN3 (9% VAc)) | YES (peeling >> 20 N/cm, typically > 30 N/cm) |
| Hifax CA 10 A or Hifax CA 12 A or mixture RCP/VLDPE 50%/50%, etc. | NO (peeling < 20 N/cm) |

Functional particles like Saytex BT 93 may be further added to the primer layer.

It has been found that a multi-layer backsheet or electrical insulation layers on a substrate (metal/tie-layer, . . . ) may be further equipped or colaminated with a (coextruded TPO-) functional PO tie-layer, which allows to obtain excellent adhesion, at lamination temperature as low as 150° C. (PE based tie-layers), even as low as 140° C., with the surface of the backside of PV cells or cells supporting film or module top layer, having a surface consisting of aluminium (usually the case of the back electrodes of PV cells), aluminium oxide (deposition by e.g. reactive sputtering of CVD) and/or that are treated by an appropriate surface treatment (e.g. aminosilane wet coating of glass) to develop functionalities able to react with the functional polyolefins (tie-layer).

The content of MAH in MAH grafted functional PE is typically around 0.2% but may be increased if required to improve adhesion. PE grafted with Maleic Anhydride are supplied e.g. by Arkema under the trade name Orevac (Orevac 18300, 18360, . . . ). Orevac 18300 is particularly useful.

Useful EAA resins are supplied e.g. by Dow under the trade name of Primacor® (Primacor 1321 or 1410).

Grafting of silane (e.g. Gamma-Methacryloxypropyl trimethoxysilane), acidic (e.g. acrylic acid), hydroxyl (e.g. hydroethylacrylate), etc. functionalities to the surface of the backsheet or electrical insulation layers on substrate adjacent the crosslinkable EVA adhesive film, by e.g. plasma techniques, are well known in the art, and are also useful. Such functionalized surface are by extension considered as coextruded or colaminated "functional PO tie-layer". For example, the surface of the said face of the backsheet or electrical insulation layers on substrate is first Corona or Plasma treated to improve wetting, then coated with a thin wet film of a diluted solution of molecules containing reactive groups like silane groups (Gamma-Methacryloxypropyl trimethoxysilane), then dried to evaporate the solvent and then cured (grafting reaction of acrylate) by atmospheric plasma or another grafting technique (gamma grafting, . . . ). The solvent is selected for its ability to solvate the TPO layer, i.e. allowing some penetration of the reactive groups containing molecules.

The adhesion between the primer layer or the functional PE tie-layer in case that this used as the back adhesive layer with FPP main layer, for example based on Hifax CA 12 A, can be obtained, if required, by compatibilizing intermediate layers which are easy to define for the man skilled in the art. Useful structures are for the sake of example as follows:

Stack of intermediate layers:
the first layer in contact with the PE based copolymer or MAH grafted PE layer is based on LLDPE or VLDPE e.g. Exact 0203, the second layer is based on a mixture of RCP (e.g. Adsyl 5C 30 F) with VLDPE plastomer (e.g. Exact 0203) in a 25%/75% ratio, the third layer is based on a mixture of RCP (e.g. Adsyl 5C 30 F) with VLDPE plastomer (e.g. Exact 0201) in a 50%/50% ratio, the fourth layer is based on a mixture Hifax CA 12 A/Exact 0201 (75/25 ratio), the fifth layer (with excellent adhesion with Hifax CA 12 A based main layer) is based on a mixture Hifax CA 12 A/Exact 0201 (87.5/12.5 ratio).

A coextruded layer of a functional PE layer (e.g. MAH grafted LLDPE) with these layers is a typical tie-layer/TPO of this invention.

The layers can be coextruded (primer or tie-layer/layers one/two(/three) together and layer (three/)four/five together with the Hifax CA 12 A based main layer) and then colaminated (possibly during module lamination).

In another useful approach the adhesion between the functional PE tie-layer with FPP main layer, for example based on Hifax CA 12 A, can be obtained with a reactive system comprising an EVOH or a PA based intermediate layer. A typical S-layer construction is:
1) Functional PE tie-layer
2) VLDPE or PE based layer possibly partly cross-linked (silane, . . . )
3) Similar layer as the functional PE tie-layer (containing e.g. MAH functionalities and/or acrylic acid functionalities) reacting with the PA layer or EVOH layer
4) PA, like PA 6 or EVOH based layer able to react and stick to layer 3 and 5)
5) A PP (RCP or Homo PP) grafted with maleic anhydride based layer (like supplied by LyondellBasell—"Plexar 600x" product range, especially Plexar 6002 and 6006 resins The 5-layer construction including the functional PE tie-layer is laminated on the FPP main layer. If layer 1) and 2) are omitted such backsheet may be used with EVA adhesive layer.

In the case of an adhesive backsheet the thickness of the FPP main layer is typically between 0.2 and 0.6 mm, depending a.o. on electrical insulation requirements, while the other layers of the backsheet including the back adhesive layer will each have a thickness of typically between a few micrometers and 50 µm or more in case of crystalline PV cells. The thickness of the intermediate layers is selected to control the flow of these layers around the PV cells.

Within the scope of this invention, a transparent upper adhesive film with controlled lateral flow can consist of a multi-layer film (coextruded or colaminated layers) A/B/C or A/A'/B/C'/C with UV and thermal stabilizers consisting of:
2 thin (typically between 5 and 50 µm) external functional PE tie-layer(s) (A and C layers) consisting e.g. of EAA or LLDPE-MAH or EVA-MAH grafted resin (PP, . . . ) with UV and thermal stabilizers.
Possibly compatibilizing layers A' and C' (Rheology, adhesion)
a TPO inner-layer or core-layer (B layer) being a multi-layer layer based on
  Plastomers (VLDPE) layers, of preferably high viscosity and of high melting temperature (more than 80° C., preferably more than 90° C.) with as example Exact 0201
  Flow resistant RCPNLDPE based blends layer(s), with as example of RCP, are Clyrell RC1414 from LyondellBasell.

Alternatively, the inner-layer may be a crosslinked (silane, peroxides, etc) PE or EVA layer.

The external layers (A and C) are preferably thin layers (<50 µm, preferably <20 µm, and typically 10 to 30 times thinner than the total thickness of the A/B/C film) and are mainly uncrosslinked but transparent enough, thanks to the small thickness, even if copolymers with high melting temperature (i.e. >95° C.) are used.

EVA grafted with MAH are well known for their clarity (Plexar® PX1164).

As the external layers (A and C) are thin adhesive films, their flow during lamination is limited. The lateral flow of the TPO inner-layer is controlled (kept acceptable) by the one of crosslinking or intercalation of RCPNLDPE layers.

Useful additives for the TPO inner layer(s) are Hals and UV absorbers, like Tinuvin 123, Tinuvin 770 and Benzophenone like Chimassorb 81 or 90, anti-oxydants, possibly clarifiers (to improve transparency) and possibly acid scavengers.

Silane or acid or hydroxyl, . . . functionalities can also be grafted to the surface of the TPO (core) layer (no need of coextruded layers). The surface to be treated is first Corona or Plasma treated to improve wetting, then coated with a thin wet film of a diluted solution of molecules containing reactive groups like silane groups (Gamma-Methacryloxypropyl trimethoxysilane), then dried to evaporate the solvent and then cured (grafting reaction) by atmospheric plasma or another grafting technique (gamma grafting, . . . ).

Preferred techniques, which can be easily adapted by the man skilled in the art, to improve, if required, adhesion of PV module components with tie-layers of this invention are:
  deposition by reactive sputtering of a nanometric layer of Al2O3 on the backside of PV films or cells and/or on the transparent conductive oxide or barrier layer of PV cells,
  atmospheric plasma cementation (adapted from U.S. Pat. No. 3,030,290) of ETFE film under e.g. N2/NH3 gas mixture (to maximize NH2 reactive groups availability at the surface of the ETFE film),
  chemical vapor deposition (possibly plasma enhanced) of a nanometric layer of Al2O3 on glass,
  wet coating of glass with a thin layer of amino-silane (e.g. Aminopropyltriethoxysilane (H2C3H6-Si(OC2H5)3)).

It is preferred to add to the composition of the backsheet anti-oxidants, HALS and UV absorber which can migrate into the adhesive layer to compensate possible loss of such additives by reaction with the peroxides (EVA adhesive) and/or by migration from the adhesive film towards the backsheet.

The total thickness of the FPP backsheet will be typically between 0.3 and 0.6 mm to achieve a system Voltage of 1000 VDC or more. The backsheet is preferably a multi-layer film to limit the risk of pin-hole, particularly in case of high concentration of pigments and functional particles.

The adhesion of the backsheet to sealants (e.g. sealant of the junction box or aluminium frame) may be improved by treating the surface of the film to be sealed e.g. with a plasma torch (local treatment) or by Corona or by Plasma (preferably atmospheric plasma—N2 or N2/H2 or N2/NH3 or N2/CO2 or Ar, etc atmosphere). The latter surface treatment is also known as a cementation treatment. Another method to enhance adhesion is to treat the backsheet with Corona treatment and coating a primer like a chlorinated polyolefin primer.

It is preferred to add at least 5% TiO2 in the composition of the backsheet or electrical insulation layers on the substrate to obtain color stability and a high solar reflectance.

The backsheet and other layers further contain UV light and thermal stabilizers (typically Irgastab FS301) and if required pigments and/or flame retardants and/or acid scavengers and/or anti-blocking material and/or scratch-resistance modifier like Ciba® IRGASURF® SR 100. The anti-oxidants of the commercial resins may be adapted to the ones of EVA adhesive layers to reduce yellowing in climatic tests.

The backsheet may also contain an encapsulated barrier layer like an aluminium layer, e.g. between the back adhesive layer and the layer of the backsheet facing the active layer (adhesion with the help of a functional PE layer like based on Orevac 18300).

A barrier layer (oxygen, water, . . . ), like an aluminium foil or aluminized film may be further included within the back adhesive layer with internal tie-layers. A useful structure is: tie-layer/multi-layer TPO/internal tie-layer/Alu foil/internal tie-layer/multi-layer TPO/backsheet.

The size of the aluminium foil may be smaller than the other layers, providing, possibly during PV module lamination, a sealed electrically safe aluminium inner-layer.

Acids, oxygen and water vapor barrier layers may be added under and/or above the interconnected PV cells, i.e. adjacent the active layer, if required. Useful barriers are SiOx or Al2O3 layers with hybrid polymers (Ormocers®) or Barix® layers (Vitex process) or layers obtained by Atomic Layer Deposition, etc.

To obtain/improve adhesion between the several layers of the PV module, the surfaces coming into contact with each other may be treated beforehand by e.g. Corona, (atmospheric or low pressure) plasma treatment/deposition, plasma polymerization, gamma irradiation, flame treatment, (reactive) sputtering (Al2O3, Al, . . . ), wet coating (of e.g. silanes like Aminopropyltriethoxysilane (H2C3H6-Si (OC2H5)3)), chemical and/or mechanical etching, Chemical Vapor Deposition (e.g. Al2O3 on glass), etc, and combinations thereof.

The back-adhesive integrated backsheet may be embossed with a pattern matching the size of the PV cells to ease their incorporation within the PV module. The upper adhesive layer may be also provided with a matching embossing pattern.

The invention will be illustrated further by reference to the attached drawings which are not meant to restrict the scope to the specific embodiments shown. Other combinations of the preferred features than those shown are also possible and advantageous. It should be appreciated that for simplicity and clarity of illustration, elements shown in the figures have not necessarily be drawn to scale.

FIG. 1 shows a cross section of a PV module with a coextruded or colaminated FPP backsheet (10), with:
i. layer (13), coming into contact with EVA adhesive layer (5), containing possibly functional particles and with a (resin part) residual (i.e. between lamination temperature and total fusion) heat of fusion of less than 30 J/g, preferably of less than 5 J/g, most preferably totally melted, to improve adhesion with EVA (5).
ii. layer (11), possibly with higher melting temperature than lamination temperature (e.g. 150° C.) to improve the dimensional stability of the back sheet (10) during lamination, with a residual heat of fusion (resin part) of at least 10 J/g, preferably at least 20 J/g.

Possible compatibilizing layers between layers 11 and 13 (designated 12 in the text) are not shown.

Figure 2:
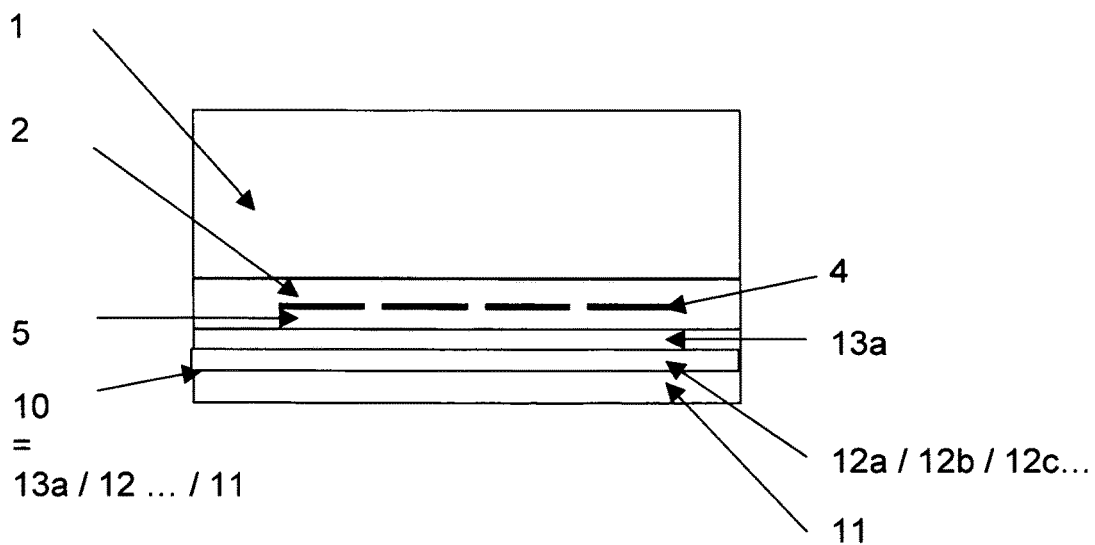

FIG. 2 shows a cross section of a PV module, with a multi-layer backsheet (10), of this invention, with:
i. a primer layer (13a).
ii. compatibilizing layers (12a/12b/12c . . . ) between layers 11 and 13a
iii. a FPP based film as main layer (11), preferably with a melting temperature of above 150° C. (more generally having a residual heat of fusion above lamination temperature of more than 10 J/g, preferably more than 20 J/g).

Figure 3:
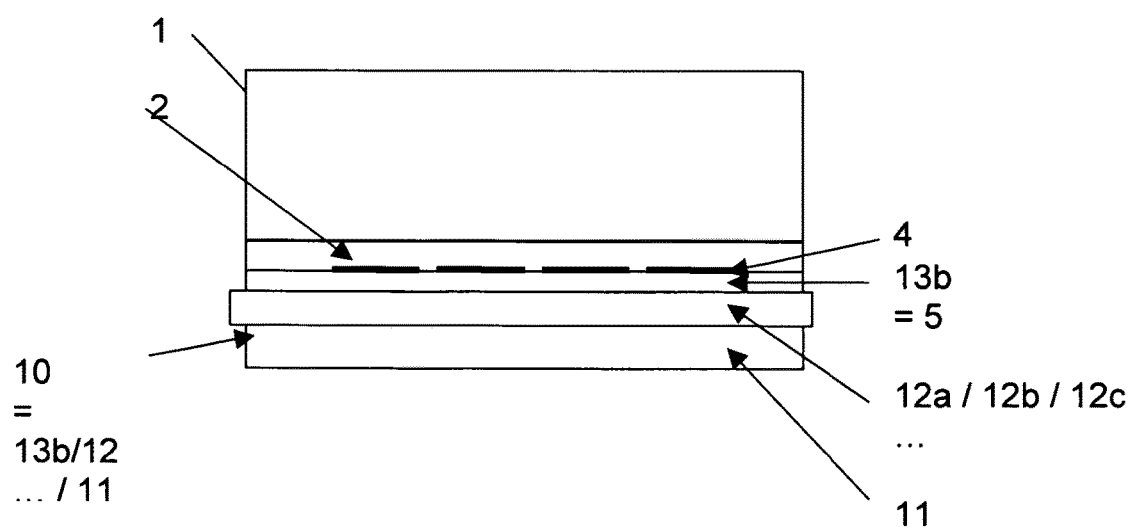

FIG. 3 shows a cross section of a PV module with:
i. a top layer (1)
ii. a transparent upper adhesive layer (2) being a tie-layer/TPO/tie-layer, having limited lateral flow (a few mm) to avoid to contaminate the membrane press, but flowing/penetrating sufficiently between cells (4) to obtain good encapsulation.
iii. PV cells (4), typically 0.25 mm thick
iv. a functional PO tie-layer (13b integrated as adhesive layer 5 on the TPO layers (12)) with good adhesion to the cells (4) back-electrode or back barrier or back primer coating and to adhesive layer (2), able to flow and penetrate sufficiently between the PV cells (4), while having a limited lateral flow (a few mm) to avoid to contaminate the membrane press,
v. TPO compatibilizing layers (12a/12b/12c . . . ) between layers 11 and 13b, able to flow and penetrate between the PV cells (4) while having a limited lateral flow (a few mm) to avoid to contaminate the membrane press,
vi. a FPP based film (11), preferably with a melting temperature of above 150° C. (more generally having a residual heat of fusion above lamination temperature of more than 10 J/g, preferably more than 20 J/g), nearly without lateral flow.

Figure 4:
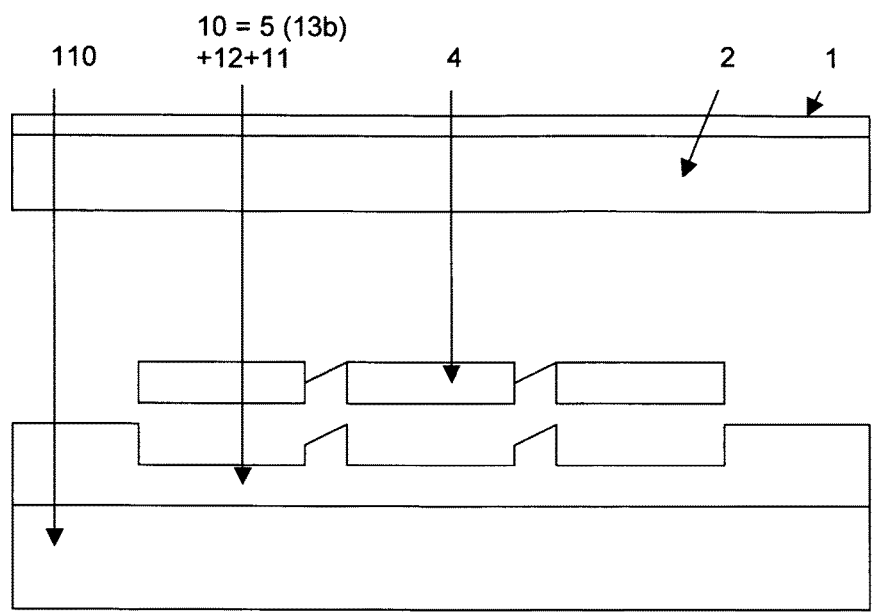

FIG. 4 shows a cross section of PV module elements with:
ii. a e.g. metal substrate (110), on which is laminated a backsheet (10) including a main layer (11), compatibilizing/adhesive layers (12), and a functional PO tie-layer (13b integrated as adhesive layer 5 on the TPO layers (12) adhesive layer (5) facing the cells (4)), is embossed with a valley pattern matching the size of the interconnected PV cells (4).
iii. the interconnected cells (4) are laid on the back-sheet (10) in the valleys, by e.g. robots.
iv. a preferably flexible front sheet (1) with adhesive (2) is then laminated onto the cells (4) inserted in the backsheet (10) on substrate (110).

Figure 5:
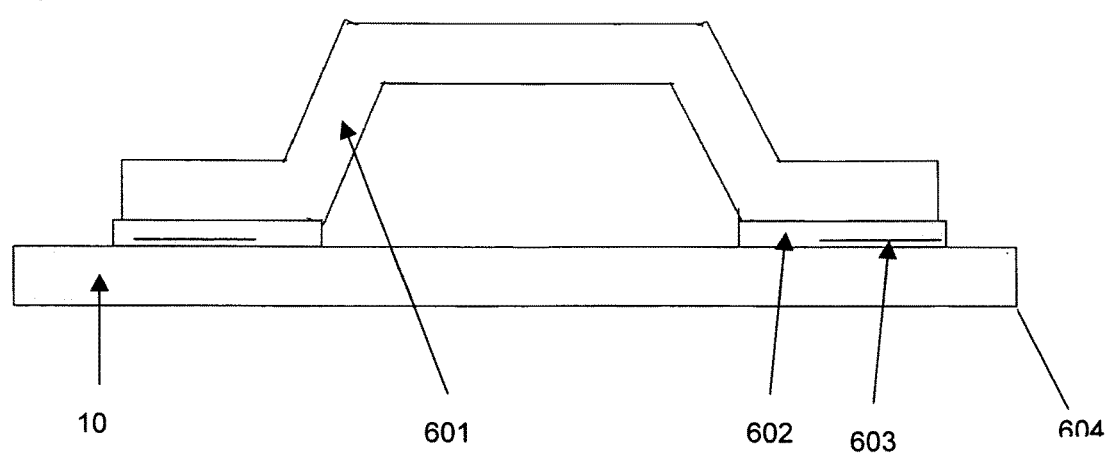

FIG. 5 shows a cross section of a junction box (601), welded on the backsheet (10) of this invention. The junction box may be made of PP. The junction box may be equipped with sealing strips (602), on base of FPP material and containing a metal strip (603) to provide eddy current weldability or a resistance to heat and melt the sealing strips. The strip 603 may also be an IR absorbing layer inside the strip 602, to provide IR laser weldability (providing the other layers are IR light transparent). The flaps (604) of the junction box may also be made of FPP to allow hot edge or hot air welding of the junction box to the backsheet (10), etc. Another useful technique is Ultra Sonic welding.

If the base of the Junction Box (601) is on base of Polyamide (e.g. PA 6 or PA 6-6), the in this case multi-layer sealing strips (602) may consist of a PP tie-layer (602a) and a thicker FPP layer (602b/c). Thin layer 602c may contain carbon black for allowing laser welding.

The junction box may be of the type with diodes together with the DC cable connections in the "removable" top cover of the housing (like supplied from Molex). Only the base of the junction box is welded to the backsheet, e.g. on base of a laser beam, which follows the inner perimeter of the base of the Junction Box above the possibly multi-layer sealing strip.

Such strip is possibly previously attached to the base of the junction box by injection/overmolding:
The sealing strip is laid on the base of the mold (602a above).

The junction box material (601) is injected and overmolded onto 602a.

Figure 6:
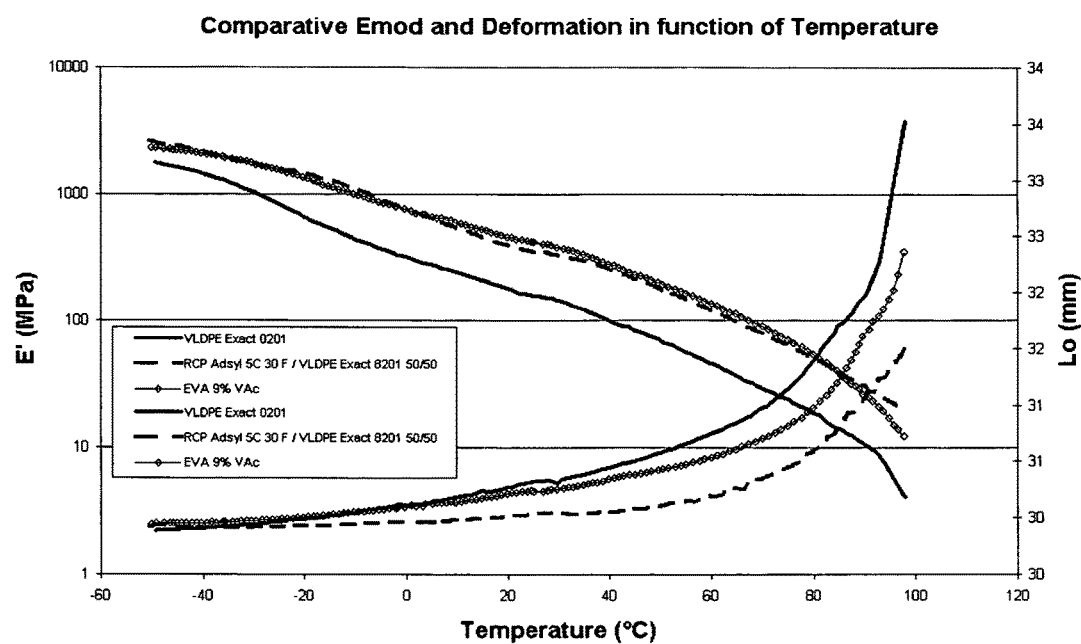

FIG. 6 shows a comparative mechanical thermal analysis (E' modulus and deformation "L0" under load) of layers useful for this invention.

EVA layers (9% VAc) are already used today as part of encapsulating layers within PV modules (Uni-Solar PVL 136 commercially available modules). Such PV modules are even directly laminated onto waterproofing membrane and installed on insulation boards (hot roof application). Such material is therefore a reference material as far as heat resistance is concerned.

The layer on base of mixture Adsyl 5C 30 F/VLDPE Exact 8201 50/50 shows a similar or better deformation under load and similar E modulus than the EVA layer.

VLDPE Exact 8201 may be replaced by VLDPE Exact 0201 to improve heat distorsion resistance.

The layer on base of VLDPE Exact 0201 is softer but the deformation remains quite acceptable up to 90° C. If required, partial e.g. silane crosslinking or addition of RCP will reduce the deformation and the flow during lamination (module encapsulation).

Figure 7:
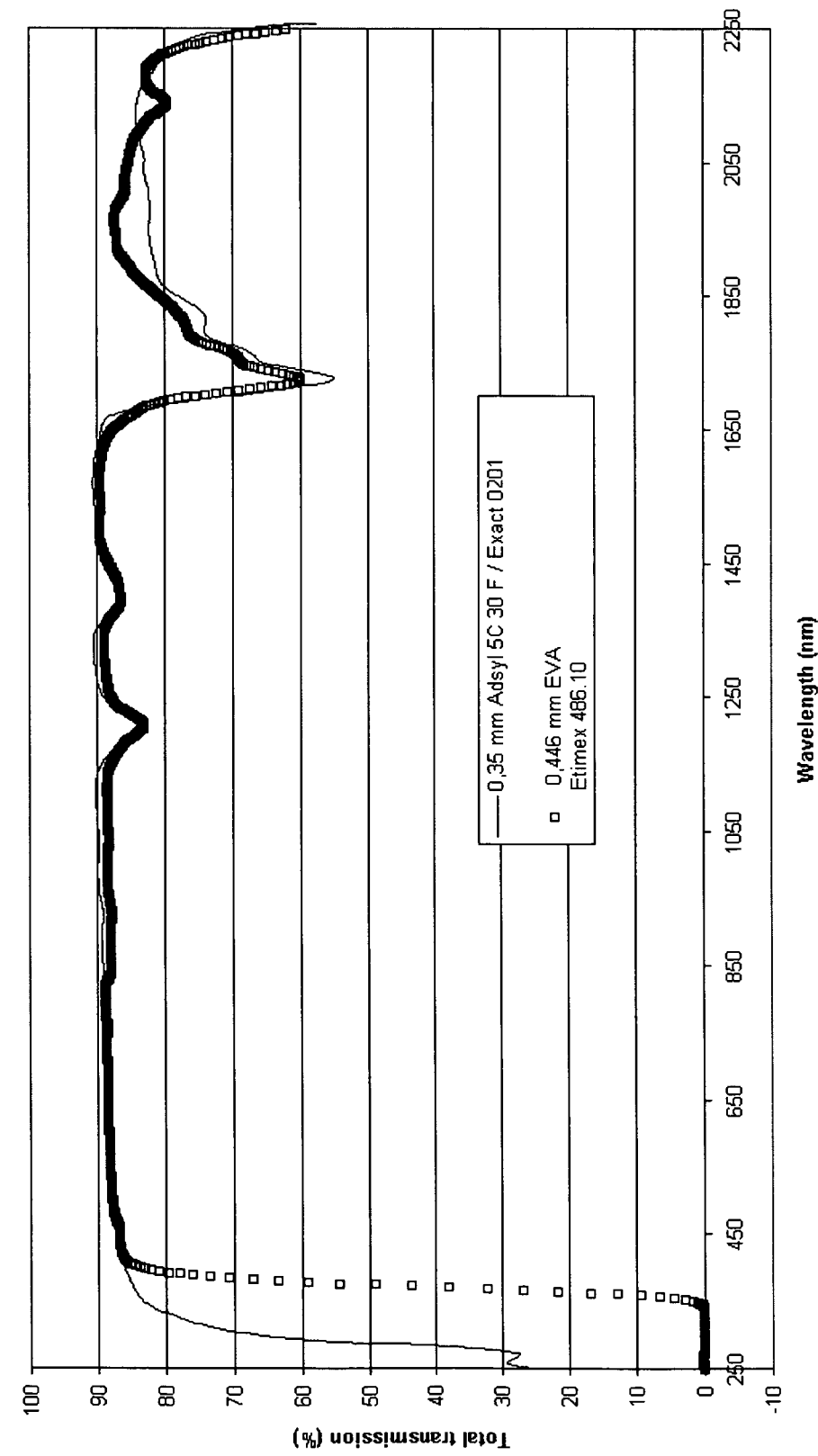

FIG. 7 shows a comparative light transmission between:
A) a 0.35 mm thick film based on a mixture of adsyl 5C 30 F/VLDPE Exact 0201 25/75 (without addition of HALS stabilizer or UV absorber)
B) a 0.460 mm thick film Etimex Vistasolar 486.10.

The light transmissions are similar (except in the UV range, because no UV absorber was added to the "adsyl 5C 30 F/VLDPE Exact 0201" film for the measurement.

The RCP is selected by the man skilled in the art to show maximal transparency at PV module operating temperature, typically 65° C.

Slightly higher light transmission is obtained with layers based on VLDPE Exact 0201 or 0203 without RCP.

Inclusion of thin layers of RCPNLDPE blends to control lateral flow is possible and provides satisfactory light transmission.

Addition of "RCP" to VLDPE leads to a more diffuse light transmission, which is generally beneficial for the efficiency of thin film PV cells.

The core layers (B) on base of e.g. VLDPE Exact 0203 crosslinked or with internal thin RCPNLDPE layers can be coextruded with external thin layers (e.g. 10 µm) on base of OREVAC 18300 functional polyolefins to produce an A/B/C structure. The very thin thickness of such A and C layers doesn't reduce significantly the light transmission of the transparent TPO film (A/B/C).

Figure 8:
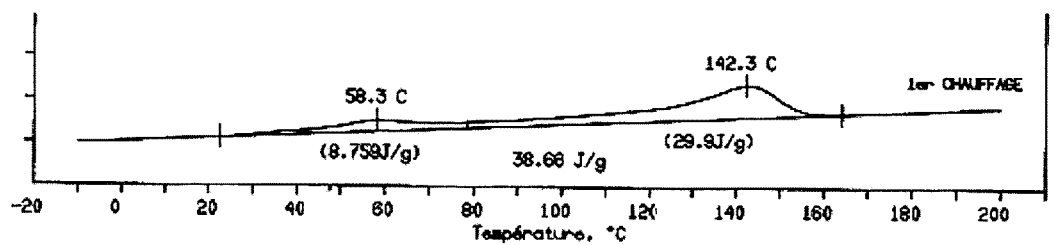
Figure 8:
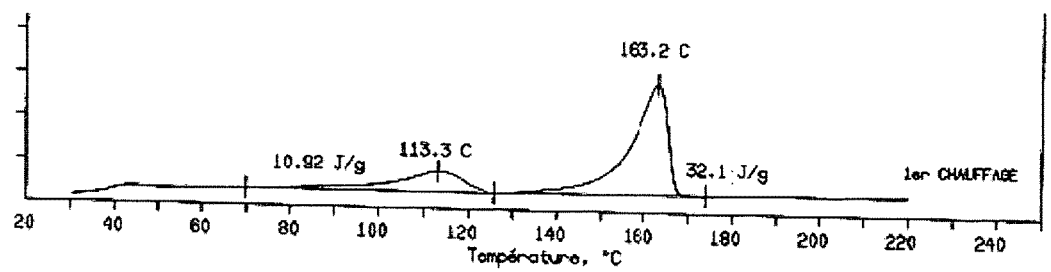

FIG. 8 shows a DSC analysis (10 K/minute) of:
i. (above) a backsheet (10) based on Hifax CA 10 A: the melting temperature is around 142° C. The residual heat of fusion above 150° C. is less than 5 J/g.
ii. (below) a backsheet (10) based on Hifax CA 12 A: the melting temperature is around 163° C. The residual heat of fusion above 150° C. is around 30 J/g.

To measure the residual heat of fusion by DSC (Differential Scanning calorimetry) of a polymeric material, one proceeds like for the measurement of the enthalpy of fusion of the polymeric material in question (according to MTM 15902). The polymeric material is heated with a speed of 10K/minute. As can be seen on FIG. 8 a baseline is drawn which refers to the specific heat (Cp) of the polymeric material. The area (A) between the base line and the curve is used to calculate the Enthalpy of fusion of the polymeric material in test using the following equation: $\Delta H = K \cdot A$, where $\Delta H$ is the enthalpy of fusion, K is the calorimetric constant, and A is the area under the curve. The calorimetric constant will vary from instrument to instrument, and is determined by analyzing a well-characterized sample with known enthalpies of transition. The residual heat of fusion, RHf, is obtained by restricting the same area A to the area Ar, on the right of (i.e. above) the lamination temperature: $RHf = K \cdot Ar$. If the layer on base of polymeric material contains a weight % Wk of inorganic fillers, the residual heat of fusion above lamination temperature of the polymeric part of the layer is obtained by: $RHf = K \cdot Ar/(1-Wf)$.

It is the first heating measurement which is relevant, i.e. on the material as it will enter the laminator.

As can be understood from FIG. 8, the melting point of a polymeric material is not sufficient to define its usefulness for this invention. It is indeed possible to have a composition with a sufficient residual heat of fusion at lamination temperature but with a melting point lower than the lamination temperature. Further a material may have an elevated melting point but may be essentially amorphous and have a too low residual heat of fusion.

Figure 9:
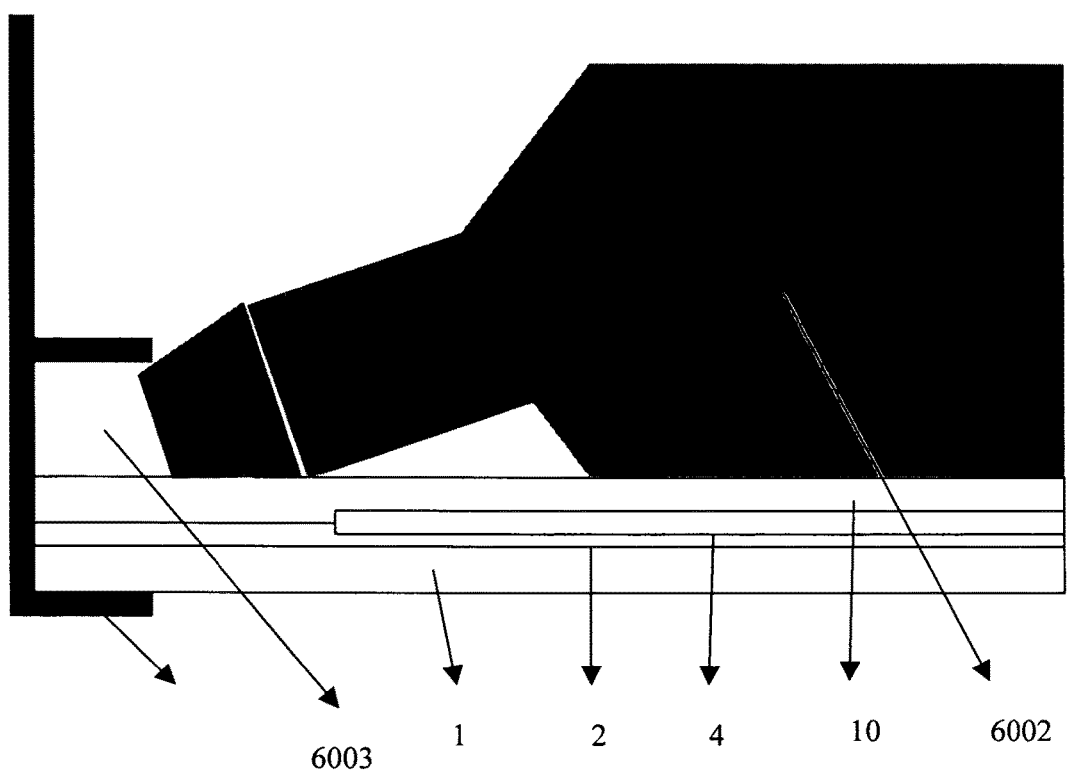

FIG. 9 shows a schematic drawing of a Hand Extruder Head (6002) sealing the backsheet (10) of the PV module with the aluminium frame (6001) on base of a extruded rod consisting of a blend on base of a functionalized FPP e.g. with grafted MAH functionalities. The rod is first produced by classical extrusion process and melted by the hand extruder (see Leister Hand Extruder instructions) and pumped in cavity (6003) between the backsheet (10) and aluminium frame (6001) for durable sealing purpose To illustrate the findings on which the invention is based, by known low shear extrusion technique, one produces the following adhesive film of 0.5 mm thickness:

Film E1): Elvax 150 (EVA with 33% VAc comonomer) from Dupont, with 0.2% Naugard P (Anti-Oxidant), 0.3% Chimassorb 81 (UV absorber from Ciba) and 0.1% Tinuvin 770 (HALS from Ciba).

Film E2): The same as film E1 but with addition of 1.5% Lupersol TBEC (fast-cure peroxide, tert-butylperoxy-2-ethylhexylcarbonate) from Arkema.

Film E3): The same as film E2 but with addition of 0.25% Z-6030 (Gamma-Methacryloxypropyl trimethoxysilane—Adhesion promotor) from Dow Corning.

Then a 0.6 mm backsheet is produced by extrusion, on base of several flexible PP resins.

Main layer A): Hifax CA 10 A (RCP based PP/EPR reactor blend with a Tm of 142° C. and a residual heat of fusion above 150° C. of less than 5 J/g, MFR=0.6 g/10 min.) from LyondellBasel.

Main layer B): Hifax CA 10 is replaced by Hifax CA 60 (equivalent to Hifax CA 10 A but with a MFR of 14 g/10 min.).

Main layer C): Hifax CA 10 is replaced by Hifax CA 12 A (Homo PP based PP/EPR reactor blend with a Tm of 163° C. and an MFR=0.9 g/10 min.).

Main layer D): Hifax CA 10 A is replaced by Hifax CA 7441 (Homo PP based PP/EPR reactor blend with a Tm of 163° C. and a residual heat of fusion above 150° C. of less than around 30 J/g—an MFR=0.9 g/10 min. and an higher EPR content)

Main layer E): Hifax CA 10 A is replaced by a mechanical blend of RCP (e.g. Adsyl 5C30F, totally melted at 150° C.) with VLDPE Exact 8201 (ratio: 50/50; 75/25; 90/10)

Main layer F): 50 parts of Saytex BT 93 (ethylene bis tetrabromophthalimide) is added to Hifax CA 10, i.e. 50 parts of Saytex BT 93 (ethylene bis tetrabromophthalimide) is mixed with 100 parts of Hifax CA 10 A resin Main layer G): 50 parts of Saytex 8010 (ethylene bis pentabromophenyl) is added to Hifax CA 10

Main layer H): 50 parts of Saytex 8010 is added to Hifax CA 60

Main layer I): the Hifax CA 10 A film is first immersed into water 80° C. during 2 hours, dried with a cloth, and then laminated Main layer J): the Hifax CA 10 A film with addition of 50 parts of Saytex BT 93 is first immersed into water 80° C. during 2 hours, dried with a cloth, and then laminated.

These backsheets are then "glued" (i.e. pressed at 150° C. during 15 minutes—4 bars) to another piece of the same backsheet with the help of the several adhesive films E1, E2 or E3 in between, in order to evaluate the adhesion performance of the three different compositions (peeling performance according to EN 12316-2). To be able to initiate and perform the peeling test, a separation strip is included between one backsheet and the adhesive film ("Backsheet/ adhesive film (E1 or E2 or E3)/separation strip/Backsheet").

The following peeling strengths are measured (comparative results as crosslinking reactions are difficult to control):

| Main layer | Adhesive film | Peel force [N/cm] |
| --- | --- | --- |
| A) | 1) | 12 |
| A) | 2) | 30 |
| A) | 3) | 40 |
| B) | 3) | 30 |
| C) | 3) | 25 |
| D) | 3) | 35 |
| E) | 3) | 42 |
| E) | 3) | 45 |
| E) | 3) | 43 |
| F) | 3) | 50 |
| G) | 3) | 30 |
| H) | 3) | 23 |
| I) | 3) | 25 |
| J) | 3) | 45 |

The experiments show clearly the effect of the addition of peroxides and silane in the EVA back adhesive layer (5). Such additives allow for a good adhesion of crosslinkable EVA adhesive films (5) with FPP layers (13) of low residual heat of fusion, laminated on main layer (11). The concentration of such additives in the EVA adhesive film may be further fine-tuned by the man skilled in the art to further improve adhesion with layers (13) of low residual heat of fusion laminated on the main layer (11).

The lower result obtained with the Hifax CA 60 based film is linked to the lower molecular weight (MFR=14 g/10 min.) which is further reduced (depolymerisation=PP chain scission) by the peroxides.

The lower result obtained with the Hifax CA 12 A based film is linked to the higher residual heat of fusion of such resin (homo PP based). A higher content of rubber (Hifax CA 7441 A) leads to better adhesion.

A mechanical blend of RCP (e.g. Adsyl 5C30F) with VLDPE Exact 8201 leads to slightly improved adhesion (compared to Hifax CA 10 A). The amount of VLDPE is not critical. VLDPE is required to achieve good impact resistance.

Adsyl 5C30F is completely melted at lamination temperature of 150° C.

The invention will be further clarified by the following examples which are not meant to restrict the scope to the specific provided examples. Other combinations of the preferred features than those shown are also possible and useful.

Example 1): Coextruded or Colaminated Backsheet Foil (10) Consisting of a FPP Layer (11) with a Higher Melting Temperature than the Module Lamination Temperature and a FPP Layer (13) with Improved Adhesion to EVA Adhesive Film (5)—FIG. 1

The following backsheet is obtained by coextrusion:

Layer 1 (11)=550 μm thick film with following composition: Hifax CA 12 A: 100 parts, with TiO2 Kronos 2220: 10 parts; Chimassorb 2020: 0.8 parts; Tinuvin 770: 0.2 parts; Chimassorb 81: 0.2 parts; Irgastab FS301: 0.3 parts.

Layer 2 (13)=50 μm thick film with following composition: Adsyl 5C 30 F (from LyondellBasell): 50 parts; Exact 8201 VLDPE (from Dexplastomer): 50 parts; TiO2 Kronos 2220: 5 parts; Chimassorb 2020: 0.8 parts; Tinuvin 770: 0.2 parts; Chimassorb 81: 0.2 parts, Irgastab FS301: 0.3 parts.

Layer 1 and 2 are produced in one step by coextrusion (manifold extrusion die).

Hifax CA 12 A is a reactor blend of PP homopolymer and EPR and has a melting temperature of 163° C. (MTM 15902), a residual heat of fusion above 150° C. of around 30 J/g, and a low Melt Flow Rate of 0.9 g/10 min. (230° C./2.16 kg—ISO 1133).

Such products have an excellent impact resistance (Ductile/Brittle Temperature Transition <=−50° C.—MTM 17238) and cold bendability at low temperature of <−40° C.

Adsyl 5C 30 F is a random copolymer of PP (comonomer=ethylene and butylene, i.e. C2, C3 C4 copolymer) and has a melting temperature of 132° C. (MTM 15902), i.e. the resin is totally melted at lamination temperature of 150° C.

Exact 8201 is a VLDPE (octene comonomer) and has a melting temperature of 73° C.

The blend of Adsyl 5C 30 F with VLDPE Exact 8201 leads to satisfactory adhesion with PP reactor blends based foils (11) and good cold foldability (<−40° C.; EN 495/5). As the EVA adhesive layer (5) is cured in contact with the "Adsyl 5C 30 F/VLDPE 8201" based layer (13), the peroxides migrate into this layer (13) and lead to partial crosslinking of the VLDPE 8201 of this layer with main layer (11), allowing good adhesion even at temperatures above the melting temperature of EXACT 8201.

If required the quantity of Exact 8201 can be reduced and/or the resin partly replaced by Exact 0201, with adaptation of compatibilizing layers (12).

Adsyl 5C 30 F alone (without VLDPE) like every RCP has poor cold foldability.

Tinuvin 770 and Chimassorb 81 are common HALS and UV absorbers of crosslinkable EVA adhesive layers (5-2). Such additives will migrate within and from the backsheet (10) to the EVA layers (5-2) to compensate losses (by migration, by peroxides degradation/reactions, . . . ).

The properties of the film are summarized in the following table, in comparison with a Tedlar/PET/Tedlar foil:

| Properties | Unit | Norm/criteria | Result on PP | Result on TPT |
| --- | --- | --- | --- | --- |
| Feeler thickness | mm | EN1849-2 | 0.57 | 0.32 |
| Shrinkage after 30 minutes 150° C. (longitudinal direction) | % | EN1107-2 | <1% | 1% |

-continued

| Properties | Unit | Norm/criteria | Result on PP | Result on TPT |
|---|---|---|---|---|
| Tensile strength | N/mm$^2$ | EN12311-2 B | >14 | 104 |
| Tensile strength After UV aging (*) | N/mm$^2$ | EN12311-2 B | >14 | — |
| Elongation at break | % | EN12311-2 B | >300 | 98 |
| Elongation at break C After UV aging (*) | % | EN12311-2 B | >300 | — |
| Partial Discharge maximum voltage | VDC | EN 60664-61730 | >1200 | 1135 |
| Water Vapour Transmission at 40° C. | g/m$^2$ · day | ISO 15106-3 | <3 | 3 |
| EVA Peel Strength (EVA Vistasolar 486) | N/cm | EN 12316-2 | >30 | >30 |
| Halogen free | | No fluoropolymer | Yes | No |
| Release from membrane Press (with Teflon protection strap) | | Visual check | OK | OK |
| Intrinsic adhesion on EVA (Elvax 150) | | >20 N/cm EN 12316-2 | No | No |
| Weldable e.g. with thermoplastic junction box or frames | | Thermoplastic | Yes | No |
| Sensitive to Hydrolysis | | Ester, Urethane bonds | No | Yes |
| Cold foldability temperature | ° C. | EN 495/5 | <−40 | <−40 |
| MFR (230° C./2.16 kg) | g/10 min | ISO 1133 | 0.9 | — |

(*) 2.500 hours of "2-SUNS" UV aging according to ISO 4892 with following particular conditions: 18 minutes cycle of deionized water spray every 2 hours, irradiance at 340 nm: 1 W/m$^2$, Borosilicate "S" type lamp filters inside & outside, black panel temperature = 88° C., test chamber temperature = 45° C.
2500 hours are equivalent to 20 years Florida with 15% reflexion by the ground (30° tilt towards the North). The FPP film (10) was laminated with a 0.460 Etimex Vistasolar 486.10 EVA adhesive on a glass plate (15 minutes 150° C. - 1 bar).

The UV aging behavior of the backsheet of this invention is excellent after an exposition to UV radiation equivalent to 20 years in Florida (backsheet application), including when the FPP foil (10) is laminated with EVA adhesive layer (5). The peroxide of the EVA film (5) doesn't impair unacceptably the durability of the backsheet (10).

The electrical properties (Partial Discharge maximum voltage) are excellent. To further improve such properties, the FPP foil of 0.6 mm may be produced by laminating together e.g. 2 foils of 0.3 mm.

The water vapor transmission of the PP foil of this invention is lower than the one of the TPT reference material.

The backsheet being thermoplastic, it is easy to weld a junction box (e.g. a PP base junction box) to the backsheet (10) by e.g. laser welding, extrusion welding of a bead, hot wedge or hot air welding, eddy current or ohmic (with inclusion of a metal strip or resistance) welding, Ultra Sonic Welding, etc. Welded parts are more reliable than glued parts.

In a classical Meyer vacuum laminator (membrane press), one produces one module (Glass (1)/EVA Vistasolar 486.10 (2) adhesive layer 0.46 mm/Crystalline Silicone Cells (4)/EVA Vistasolar 486.10 (5) adhesive layer 0.46 mm/FPP Backsheet (10) of this example 1 (layer 13 facing the cells (4)), according to conditions well known by the man skilled in the art (30 minutes cycle—150° C.).

The adhesion between the FPP foil (10=13/11) and EVA (5) is measured and found not less than 40 N/cm.

Neither contamination of the membrane of the press, nor problems with dimensional stability, nor damage to the backsheet (10) are observed. The flow of the backsheet (10) of example 1 is very limited.

The intrinsic adhesion with EVA (Elvax 150) of layer 13 (mixture Adsyl 5C 30 F NLDPE Exact 8201) is anyway bad (clearly less than 20 N/cm, as it is the case for the TPO foil (100) of example 1). The peroxides and silanes of the EVA adhesive layer (Vistasolar 486.10) trigger surprisingly the adhesion.

Example 2) Backsheet with Primer Layer (13a)—FIG. 2

It has been observed that the adhesion between FPP backsheet (10) and EVA adhesive (5) may become low after storage e.g. in humid conditions, resulting in extreme cases to an adhesion value between FPP backsheet (10) and EVA adhesive layer (5) as low as the intrinsic adhesion value (typically 12 N/cm).

After extensive work and research, the reliability of the adhesion of the backsheet (10) of this invention to EVA adhesive layer (5) of e.g. the type Etimex 486.10, has been improved by coextrusion or colamination of the FPP foil (11) with a "primer" layer (13a) which shows intrinsic adhesion with the EVA adhesive layer (5).

Therefore, one produces by e.g. coextrusion and lamination the following multi-layer film:

Layer 1 (13a)=10 μm thick layer based on EVA (Poly-ethylene-Vinyl Acetate) with e.g. 9% Vinyl Acetate Copolymer (e.g. EVA 1010VN3 from Total Petrochemicals), with pigments, possibly functional particles and additives e.g. as shown in the previous example.

Layer 2 (12a)=10 μm thick layer of PE based resin (e.g. Exact 0203 VLDPE from Dexplastomer), with pigments and additives e.g. as shown in the previous example.

Layer 3 (12b)=40 μm thick layer based on a mixture of 25 parts of Random PP copolymer (e.g. Adsyl 5C 30 F from LyondellBasell) and 75 parts of PE (e.g. Exact 0201 VLDPE from Dexplastomer), with pigments and additives e.g. as shown in the previous example.

Layer 4 (12 c)=40 μm thick layer based on a mixture of 50 parts of Random PP copolymer (e.g. Adsyl 5C 30 F from LyondellBasell) and 50 parts of PE (e.g. Exact 0201 VLDPE from Dexplastomer), with pigments and additives e.g. as shown in the previous example.

Layer 4bis (12 c bis)=20 μm thick layer based on a mixture of 50 parts of Random PP copolymer (e.g.

Adsyl 5C 30 F from LyondellBasell) and 50 parts of PE (e.g. Exact 0201 VLDPE from Dexplastomer), with pigments and additives e.g. as shown in the previous example.

Layer 5 (12 d)=20 μm thick film layer with following composition: Hifax CA 12 A: 50 parts, Exact 0201 50 parts with pigments and additives e.g. as shown in the previous example.

Layer 6 (12 e)=40 μm thick film layer with following composition: Hifax CA 12 A: 75 parts, Exact 0201 25 parts with pigments and additives e.g. as shown in the previous example.

Layer 7 (12 f=11)=420 μm thick film layer with following composition: Hifax CA 12 A: 100 parts, with pigments and additives e.g. as shown in the previous example.

Layers 1 to 4 are coextruded and then colaminated with coextruded layers 4bis to 7 to obtain the backsheet (10):
(11)=FPP layer(s)
(12a) on (12b) on (102c) . . . =compatibilizing layers
(13a)=EVA primer layer It has been found that the adhesion of layer (13a) on crosslinkable EVA adhesive layer (5) is more reliable (better intrinsic adhesion) in the time (shelf-life issue) and less sensitive to lamination conditions than in case of the FPP foil (11) alone.

Layer (11) and (12, 12b, . . . ) may contain anti-acids (acid scavengers, like hydrotalcite and/or metal stearates, etc.).

In a classical Meyer vacuum laminator (membrane press), one produces one module (Glass (1)/EVA Vistasolar 486.10 (2) adhesive layer 0.46 mm/Crystalline Silicone Cells (4)/ EVA Vistasolar 486.10 (5) adhesive layer 0.46 mm/FPP Backsheet (10) of this example 2 (layer 13a facing the cells (4)), according to conditions well known by the man skilled in the art (30 minutes cycle—150° C.). The adhesion between the backsheet foil (10) and EVA adhesive film (5) is measured and found not less than 30 N/cm. Inclusion of functional fillers in layer (13a) improves the adhesion on EVA adhesive film (5).

Example 3) Backsheet with Integrated Adhesive Layer, Functional PO Tie-Layer (13b=5)—FIG. 3

By coextrusion one produces the following multi-layer film:

Layer one (13b)=20 μm thick layer based on LLDPE-MAH grafted like Orevac 18300 from Arkema, with additives e.g. like Tinuvin NOR 371 FF: 0.8 parts, Chimassorb 81: 0.2 parts, Irgastab FS301: 0.3 parts, possibly with pigments like carbon black or TiO2 (without pigments if the layer flows until above the PV cells).

Layer two (12a)=40 μm thick layer of PE based resin (e.g. Exact 0203 VLDPE from Dexplastomer), with additives e.g. as shown in the previous examples and possibly with pigments.

Layer three (12b)=40 μm thick layer based on a mixture of 25 parts of Random PP copolymer (e.g. Adsyl 5C 30 F from LyondellBasell) and 75 parts of PE (e.g. Exact 0201 VLDPE from Dexplastomer), with additives e.g. as shown in the previous examples and with possibly pigments.

Layer four (12c)=60 μm thick layer based on a mixture of 50 parts of Random PP copolymer (e.g. Adsyl 5C 30 F from LyondellBasell) and 50 parts of PE (e.g. Exact 0201 VLDPE from Dexplastomer), with additives e.g. as shown in the previous examples and with possibly pigments.

Further layers: as example 2. Coextruded layers 1 to 4 are colaminated with coextruded layers 4bis to 7 (possibly within the PV module laminator) to obtain the backsheet (10):
(11)=FPP layer(s)
(12a) on (12b) on (102c) . . . =compatibilizing and lamination flowing layers
(13b)=functional PO tie-layer and lamination flowing layer.

RCP of higher melting temperature and or lower MFR than Adsyl 5C 30F may be used to reduce flow.

The thickness and softness of the several layers may be modified to improve the flow around cells (4) if required.

Example 4): Backsheet with Integrated Adhesive Layer, Functional PO Tie—Layer (13b=5)—FIG. 3, Comprising an Intermediate Layer (12b) with Elastomer PP The main layer backsheet (11) is as example based on following coextruded layers:
(11a) A 50 μm rear layer on base of Hifax CA 12 A (same additives as in example 1) or on base of a mixture of Hifax CA 12 A, CA 10 A and CA 60 (same additives as in example 1).
(11b) A 300 μm core on base of a homopolymer PP impact modified, with additives (like in example 1))
(11c or 12c) A 50 μm front layer on base of Hifax CA 10 A and Hifax CA 60 (same additives as in example 1) or on base of a mixture of Hifax CA 12 A, Hifax CA 10 A and Hifax CA 60.

The intermediate layers (12) are reduced to 2 layers thanks to the incorporation of Elastomer PP (Versify 2400) which improves compatibility:
(12b) A 50 μm thick TPO (FPP) intermediate layer 1, with following composition:
  Hifax CA 10 A (PP/EPR reactor blend from Lyondell-Basell): 10 parts
  Hifax CA 60 (PP/EPR reactor blend from LyondellBasell): 30 parts
  Versify 2400.01 (elastomer PP resin from DOW): 10 parts
  Exact 0203 (VLDPE resin from Dexplastomer): 50 parts
  TiO2 Kronos 2220: 5 parts;
  Chimassorb 2020: 0.8 parts;
  Tinuvin 770: 0.2 parts;
  Chimassorb 81: 0.2 parts,
  Irgastab FS301: 0.3 parts.
(12a) a 300 μm thick TPO intermediate layer 2, with following composition:
  Exact 0201 (VLDPE resin from Dexplastomer): 100 parts
  TiO2 Kronos 2220: 5 parts;
  Chimassorb 2020: 0.8 parts;
  Tinuvin 770: 0.2 parts;
  Chimassorb 81: 0.2 parts,
  Irgastab FS301: 0.3 parts.

The tie-layer (13b) is as follows:
(13b) a 30 μm thick tie-layer, with following composition:
  Orevac 18300 (LLDPE-MAH grafted from Arkema)
  Tinuvin NOR 371 FF (NOR-HALS from Ciba): 0.8 parts,
  Chimassorb 81: 0.2 parts,
  Irgastab FS301: 0.3 parts
  TiO2 Kronos 2220: 10 parts, to limit yellowing in aging and due to stabilizers (HALS, . . . )

Layer (11) and (12a, 12b) may contain anti-acids (acid scavengers, like hydrotalcite and/or metal stearates, etc.). Preferably layers (11)/(12b) are coextruded together and colaminated on coextruded together layers (12b)/(12a)/(13b).

In a classical Meyer vacuum laminator (membrane press), one produces a PV module (4 mm tempered low iron Glass (1)/EVA Vistasolar 486.10 (2) adhesive layer 0.46 mm/250 µm thick Crystalline Silicone Cells (4)/adhesive integrated backsheet (10) 13b/12a/12b/11, according to conditions well known by the man skilled in the art (30 minutes cycle—145° C.).

The adhesion between the adhesive integrated backsheet 13b/12a/12b/11 and EVA (2) is measured by peeling according to EN 12316-2. The adhesion is excellent (>40 N/cm) and no internal delamination is observed thanks to the excellent compatibility between the several layers. After immersion in water 60° C. during 3 months, the adhesion remains excellent The PV module is better protected against humidity than with EVA/TPT layers. The tie-layer/TPO back adhesive system is far less permeable to water vapor than EVA. The produced module is free of defect.

Example 5): Backsheet with Integrated Adhesive Layer, Functional PO Tie—Layer (13b=5)—FIG. 3, Comprising a Reactive System of Intermediate Layers and a VLDPE Encapsulating Layer (12)

By coextrusion one produces around 255° C. the following five layers multi-layer film:

Layer one (13b)=20 µm thick layer based on LLDPE-MAH grafted like Orevac 18300 from Arkema, with additives e.g. like Tinuvin NOR 371 FF: 0.8 parts, Chimassorb 81: 0.2 parts, Irgastab FS301: 0.3 parts, possibly with pigments like carbon black or TiO2 (without pigments if the layer flows until above the PV cells).

Layer two (12a)=290 µm thick layer of PE based resin (e.g. Exact 0203 VLDPE from Dexplastomer), with additives e.g. as shown in the previous examples and possibly with pigments. This layer maybe partly cross-linked (e.g. by steam and for such purpose it will contain grafted silanes, . . . )

Layer three (12b)=20 µm thick layer based on LLDPE-MAH grafted like Orevac 18300 from Arkema, with additives e.g. like Tinuvin NOR371 FF: 0.8 parts, Chimassorb 81: 0.2 parts, Irgastab FS301: 0.3 parts, possibly with pigments like carbon black or TiO2 (without pigments if the layer flows until above the PV cells).

Layer 4 (12c)=150 µm thick layer based on PA 6 (PA6 Ultramid B36LN from BASF) with usual stabilizers, additives and pigments, and if required with usual hydrolysis stabilizer Layer 5 (12d)=20 µm thick layer based on RCP-MAH grafted like Admer QF 551E from Mitsui, with additives e.g. like Tinuvin NOR 371 FF: 0.8 parts, Chimassorb 81: 0.2 parts, Irgastab FS301: 0.3 parts, possibly with pigments like carbon black or TiO2.

This five layer 500 µm film is colaminated (in-line by extrusion coating or off-line) with the FPP layer (11), layer (12d) in contact with layer (11), layer (11) being e.g. an extruded 300 µm layer on base of the following composition: Hifax CA 12 A: 100 parts, with TiO2 Kronos 2220: 10 parts; Chimassorb 2020: 0.8 parts; Tinuvin 770: 0.2 parts; Chimassorb 81: 0.2 parts; Irgastab FS301: 0.3 parts.

One obtains the following adhesive integrated 800 µm backsheet (10):
(11)=FPP layer(s)
(12a) on (12b) on (12c) on 12 (d)=compatibilizing and lamination flowing layers. Layer (12c) is a heat resistant layer.
(13b)=functional PO tie-layer and lamination flowing layer.

Layers (13b)/(12a) can be coextruded separately, layer (12a) being submitted to steam to initiate cross-linking (if layer 12a is provided with grafted silane functionalities) and directly laminated on layer (12b) of film (12b)/(12c)/(12d) obtained by coextrusion.

Thanks to the reactive system, adhesion between layers is excellent even after lamination required to produce PV modules.

Example 6: Transparent TPO Layer (2)—FIG. 3

By manifold coextrusion, or combination of extrusion and lamination (extrusion coating), one produces the following transparent tie-layer/TPO/tie-layer upper adhesive layer (2), consisting of the following layers:

i. 10 µm thick layer based e.g. on LLDPE-MAH grafted like Orevac 18300 from Arkema, with NOR-HALS (e.g. 0.5 parts Tinuvin 123), possibly UV absorbers (Chimassorb 81, 0.3 parts) and usual anti-oxydants allowing transparency.

ii. 90 µm thick layer based e.g. on a mixture of 100 parts of Exact 0201 VLDPE from Dexplastomer, with Tinuvin 770 (0.3 parts), possibly UV absorber (Chimassorb 81, 0.3 parts) and usual anti-oxydants allowing transparency.

iii. A 200 µm transparent TPO-layer being:

A mono-layer based e.g. on 100 parts Octene type VLDPE ("Exact" types from Dexplastomer), with e.g. Tinuvin 770 (0.3 parts), possibly UV absorber (Chimassorb 81, 0.3 parts) and usual anti-oxydants allowing transparency, grafted with vinyl silane during extrusion and steam crosslinked afterwards.

A multi-layer layer consisting of the following layers:
1. 15 µm thick layer based e.g. on a mixture of 75 parts of Exact 0201 VLDPE from Dexplastomer and 25 parts of RCP (Clyrell RC 1414), with Tinuvin 770 (0.3 parts), possibly UV absorber (Chimassorb 81, 0.3 parts) and usual anti-oxydants allowing transparency.
2. 20 µm thick layer based e.g. on a mixture of 50 parts of Exact 0201 VLDPE from Dexplastomer and 50 parts of RCP (Clyrell RC 1414), with Tinuvin 770 (0.3 parts), possibly UV absorber (Chimassorb 81, 0.3 parts) and usual anti-oxydants allowing transparency.
3. 15 µm thick layer based e.g. on a mixture of 75 parts of Exact 0201 VLDPE from Dexplastomer and 25 parts of RCP (Clyrell RC 1414), with Tinuvin 770 (0.3 parts), possibly UV absorber (Chimassorb 81, 0.3 parts) and usual anti-oxydants allowing transparency.
4. 100 µm thick layer based e.g. on a mixture of 100 parts of Exact 0201 VLDPE from Dexplastomer, with Tinuvin 770 (0.3 parts), possibly UV absorber (Chimassorb 81, 0.3 parts) and usual anti-oxydants allowing transparency.
5. 15 µm thick layer based e.g. on a mixture of 75 parts of Exact 0201 VLDPE from Dexplastomer and 25 parts of RCP (Clyrell RC 1414), with Tinuvin 770

(0.3 parts), possibly UV absorber (Chimassorb 81, 0.3 parts) and usual anti-oxydants allowing transparency.

6. 20 μm thick layer based e.g. on a mixture of 50 parts of Exact 0201 VLDPE from Dexplastomer and 50 parts of RCP (Clyrell RC 1414), with Tinuvin 770 (0.3 parts), possibly UV absorber (Chimassorb 81, 0.3 parts) and usual anti-oxydants allowing transparency.

7. 15 μm thick layer based e.g. on a mixture of 75 parts of Exact 0201 VLDPE from Dexplastomer and 25 parts of RCP (Clyrell RC 1414), with Tinuvin 770 (0.3 parts), possibly UV absorber (Chimassorb 81, 0.3 parts) and usual anti-oxydants allowing transparency.

iv. 90 μm thick layer based e.g. on a mixture of 100 parts of Exact 0201 VLDPE from Dexplastomer, with Tinuvin 770 (0.3 parts), possibly UV absorber (Chimassorb 81, 0.3 parts) and usual anti-oxydants allowing transparency.

v. 10 μm thick layer based e.g. on LLDPE-MAH grafted like Orevac 18300 from Arkema, with NOR-HALS (e.g. 0.5 parts Tinuvin 123), possibly UV absorbers (Chimassorb 81, 0.3 parts) and usual anti-oxydants allowing transparency.

At typical lamination temperature of 150° C., VLDPE Exact 0201 has a high tendency to flow, which leads to several production difficulties (movement of PV cells, contamination of laminator straps, uneven upper-adhesive thickness, etc. . . . ). Crosslinking or inclusion of layers on base of RCP/VLDPE formulations much improves the process, which furthermore may be conducted at lower temperature (typically 140° C.), because no EVA needs to be cured.

Example 7): PV Module Production

In a membrane press, one produces PV modules of the following composition:
a) A 4 mm glass plate (1) which is surface coated by CVD with a nano-layer of Al2O3 (by pyrolytic decomposition of an aerosol of a salt of aluminium, just after the floating production step of the glass) at the surface of the plate coming into contact with upper-adhesive layer (2)-b)
b) The upper adhesive layer (2) of example 4)
c) Interconnected Crystalline Silicon Cells (4) or thin film cells on plastic, etc., possibly with treated surfaces to better adhere to b (2) and d (10))
d) A back-adhesive integrated back-sheet (10) of example 3).

The lamination is done at 15 minutes at 145° C. The adhesion between the several layers is excellent and acceptable lateral flow is observed.

Lamination at lower temperature is also possible but required longer contact time to achieve desired adhesion.

Example 8)—Adhesion of a Junction Box Multi-Contact with Self-Adhesive

The back sheet of the PV module of example 8) is treated locally with a plasma torch from Tantec (PlasmaTec—1000 Watts—100% Voltage). The surface tension of the TPO backsheet (10) reaches 50 mN/m. The PV-Junction box PV-JB-LC supplied by Multi-contact is pressed on the treated zone as recommended by the supplier.

The junction box adhesion is tested by manual peeling after 24 hours. One observes cohesive failure within the self-adhesive.

The same Plasma Torch may be used to treat the edges of the backsheet (100) of the laminated modules to obtain if required good adhesion e.g. with silicone or PUR sealants.

As will be apparent the foregoing description does not cover all possible combinations. Other combinations may be derived by the man skilled in the art from the present description and are useful.

The disclosure of EP 09009543.1 and EP 09015706.6 is incorporated herein by reference.

LIST OF REFERENCE NUMBERS

1 top layer
2 upper adhesive layer
4 photovoltaic cells, active material
5 back adhesive layer
10 backsheet
11 main layer
12 compatibilizing layer
13 layer facing the active layer
110 substrate
601 junction box
602 sealing strip
603 metal strip
604 flap
6001 aluminiumframe
6002 hand extruder head
6003 cavity

The invention claimed is:

1. A multi-layer PV module backsheet comprising:
a coextruded multilayer film comprising
 i. a UV stabilized flexible polypropylene FPP main layer having a residual heat of fusion between module lamination temperature and end of fusion of more than 20 J/g, and
 ii. at least one layer based on a TPO polymer blend which has a residual heat of fusion between module lamination temperature and end of fusion of less than 5 J/g, wherein the at least one layer faces one or more cells;
wherein the FPP is selected from the group consisting of:
mechanical or reactor blends of PP with ethylene propylene rubber, mechanical FPP blends of PP with elastomer PP, mechanical FPP blends of PP with linear low density polyethylene or very low density polyethylene plastomers, thermoplastic vulcanisates blends based on blends of PP with EPDM rubber, or blends thereof.

2. A backsheet according to claim 1, wherein the melt flow rate of the used FPP resin blends is lower than 10 g/10 min.

3. A backsheet according to claim 1, wherein the backsheet is laminated or coextruded with a primer layer which has intrinsic adhesion with an EVA adhesive layer.

4. A backsheet according to claim 1, wherein the backsheet is laminated or coextruded with a functional PO layer.

5. A backsheet according to claim 1, wherein the backsheet contains functional particles.

6. A backsheet according to claim 5, wherein the functional particles are ethylene bis tetra bromo phthalimide.

7. A backsheet according to claim 3, further comprising at least one intermediate layer, wherein the intermediate layer comprises an FPP compatibilizing resin blend comprising Polypropylene and (co-)Polyethylene, wherein the intermediate layer is located between the main layer and the primer layer.

8. A backsheet according to claim 4, further comprising at least one intermediate compatibilizing layer, wherein the intermediate layer comprises a 3-layer reactive system, wherein the first layer faces the main layer and comprises a functionalized PP based tie-layer, the second layer comprises a reactive inter-layer, and the third layer faces the functional PO layer.

9. A backsheet according to claim 1, further comprising at least one FPP based intermediate layer, wherein said intermediate layer or layers comprises one or more intermediate compositions between the compositions of the layer facing the cells and the main layer, wherein said layer or layers gradually match the compositions and rheology of the layers to be brought together.

10. A backsheet according to claim 7, wherein at least one intermediate FPP layer comprises VLDPE or Elastomer PP resin or a blend thereof.

11. A backsheet according to claim 4, further comprising a TPO intermediate layer in direct contact with the functional PO layer, wherein the intermediate layer is based on (co-)Polyethylene Plastomers.

12. A backsheet according to claim 1, wherein the FPP is a mechanical FPP blend of PP with linear low density polyethylene or very low density polyethylene plastomers, wherein the linear low density polyethylene or very low density polyethylene plastomers are selected from the group consisting of:
olefin block copolymers of crystalline PE parts and amorphous copolymerized PE parts,
polyethylene plastomers or linear low density polyethylene obtained by copolymerization of ethylene with short-chain alpha-olefins with a density of less than 925 kg/m$^3$ (ISO 1183),
and copolymers of ethylene with polar comonomers chosen from vinyl acetate, acrylic ester, acrylic acid, methacrylic acids, ionomers.

13. A backsheet according to claim 1, wherein the TPO is selected from the group consisting of:
flexible polypropylene (FPP) mechanical or reactor blends of PP with ethylene propylene rubber;
mechanical FPP blends of PP with elastomer PP;
mechanical FPP blends of PP with linear low density polyethylene or very low density polyethylene plastomers;
polymerization FPP blends of PP blocks with PE blocks;
polyethylene plastomers or linear low density polyethylene obtained by copolymerization of ethylene with short-chain alpha-olefins with a density of less than 925 kg/m$^3$ (ISO 1183);
copolymer of ethylene with polar comonomers chosen from vinyl acetate, acrylic ester, acrylic acid, methacrylic acids, maleic anhydride, ionomers;
grafted copolymer of ethylene with acrylic acid, methacrylic acids, maleic anhydride (MAH), glycidyl methacrylate, hydroxyalkylacrylate;
or blends thereof.

14. A PV module comprising the backsheet according to claim 1.

15. A PV module according to claim 14, further comprising an upper adhesive layer based on ionomers or on PE tie-layers or on (co-)Polyethylene with external layers on the base of PE tie-layers.

16. A PV module according to claim 15, wherein the upper adhesive layer is a transparent functionalized TPO or tie-layer/TPO/tie-layer, wherein the TPO layer has a low lateral flow at lamination temperature by one of crosslinking or providing internal RCP/VLDPE layers.

17. A PV module according to claim 14, wherein at least one PE tie-layer is based on (co-)PE grafted with Maleic Anhydride, or on (co-)PE grafted with less than 1% weight of Maleic Anhydride.

18. A PV module according to claim 14, further comprising a junction box welded on the backsheet.

19. A PV module according to claim 14, further comprising a junction box glued on the at least locally plasma surface treated backsheet.

20. A PV module according to claim 14, further comprising a top layer, wherein the top layer comprises a glass plate, wherein side facing cells of the glass plate is equipped by CVD (pyrolitic decomposition) with a nano-layer of $Al_2O_3$.

21. A PV module according to claim 14, further comprising a barrier film and at least one active layer, wherein the barrier film is under the active layer or layers.

22. A PV module according to claim 14, further comprising an aluminium frame, wherein the aluminum frame is sealed to the backsheet by using an extruded rod with an external layer based on functionalized PP or functionalized FPP.

23. A method of preparing a PV module, comprising:
incorporating the backsheet according to claim 1 as an integrated insulation layer on a metallic or a metal/polymer composite substrate.

24. A backsheet according to claim 4, further comprising at least one intermediate layer, wherein the intermediate layer comprises an FPP compatibilizing resin blend comprising Polypropylene and (co-)Polyethylene, wherein the intermediate layer is located between the main layer and the functional PO layer.

25. A backsheet according to claim 24, wherein at least one intermediate FPP layer comprises VLDPE or elastomer PP or a blend thereof.

26. A multi-layer PV module backsheet consisting of:
a coextruded multilayer film consisting of
i. a UV stabilized flexible polypropylene FPP main layer having a residual heat of fusion between module lamination temperature and end of fusion of more than 20 J/g,
ii. at least one layer based on a TPO polymer blend which has a residual heat of fusion between module lamination temperature and end of fusion of less than 5 J/g, wherein the at least one layer faces one or more cells, and
iii. at least one intermediate layer, wherein the intermediate layer is based on PE, FPP, or PE and FPP and is a compatibilizing or adhesive layer located between the main layer and the at least one layer that faces one or more cells;
wherein the FPP of layers (i) and (iii) are each independently selected from the group consisting of: mechanical or reactor blends of PP with ethylene propylene rubber, mechanical FPP blends of PP with elastomer PP, mechanical FPP blends of PP with linear low density polyethylene or very low density polyethylene plastomers, thermoplastic vulcanisates blends based on blends of PP with EPDM rubber, or blends thereof.

27. The multi-layer backsheet according to claim 26, wherein the backsheet is laminated or coextruded with a primer layer which has intrinsic adhesion with an EVA adhesive layer.

28. The multi-layer backsheet according to claim 26, the backsheet is laminated or coextruded with a functional PO layer.

29. The multi-layer backsheet according to claim 26, wherein the one or more compatibilizing layer(s) have adapted compositions providing good adhesion between the layers of the backsheet and good extrusion rheology.

30. The multi-layer backsheet according to claim 26, wherein the backsheet contains functional particles.

31. The multi-layer backsheet according to claim 26, wherein functional particles are added in a material composition of the layer facing the active layer.

32. The multi-layer backsheet according to claim 31, wherein the functional particles are ethylene bis tetra bromo phthalimide.

33. The multi-layer backsheet according to claim 26, wherein the at least one intermediate layer comprises an FPP compatibilizing resin blend comprising Polypropylene and (co-)Polyethylene.

34. The multi-layer backsheet according to claim 26, wherein the TPO is selected from the group consisting of:
flexible polypropylene (FPP) mechanical or reactor blends of PP with ethylene propylene rubber;
mechanical FPP blends of PP with elastomer PP;
mechanical FPP blends of PP with linear low density polyethylene or very low density polyethylene plastomers;
polymerization FPP blends of PP blocks with PE blocks;
polyethylene plastomers or linear low density polyethylene obtained by copolymerization of ethylene with short-chain alpha-olefins with a density of less than 925 kg/m$^3$ (ISO 1183);
copolymer of ethylene with polar comonomers chosen from vinyl acetate, acrylic ester, acrylic acid, methacrylic acids, maleic anhydride, ionomers;
grafted copolymer of ethylene with acrylic acid, methacrylic acids, maleic anhydride (MAH), glycidyl methacrylate, hydroxyalkylacrylate;
or blends thereof.

35. The multi-layer backsheet according to claim 26, wherein all its layers are coextruded or colaminated.

36. The multi-layer backsheet according to claim 26, wherein all its layers are coextruded.

37. A multi-layer backsheet consisting of:
a coextruded multilayer film consisting of
i. a UV stabilized flexible polypropylene FPP main layer having a residual heat of fusion between module lamination temperature and end of fusion of more than 20 J/g,
ii. at least one layer based on a TPO polymer blend which has a residual heat of fusion between module lamination temperature and end of fusion of less than 5 J/g, wherein the at least one layer faces one or more cells, and
iii. an intermediate layer located between the main layer and the at least one layer that faces one or more cells, the intermediate layer comprising a 3-layer reactive system, wherein the first layer faces the main layer and comprises a functionalized PP based tie-layer, the second layer comprises a reactive inter-layer, and the third layer is or faces the layer based on the TPO polymer blend facing the one or more cells;
wherein the FPP is selected from the group consisting of:
mechanical or reactor blends of PP with ethylene propylene rubber, mechanical FPP blends of PP with elastomer PP, mechanical FPP blends of PP with linear low density polyethylene or very low density polyethylene plastomers, thermoplastic vulcanisates blends based on blends of PP with EPDM rubber, or blends thereof.

38. The multi-layer backsheet according to claim 37, wherein the TPO is selected from the group consisting of:
flexible polypropylene (FPP) mechanical or reactor blends of PP with ethylene propylene rubber;
mechanical FPP blends of PP with elastomer PP;
mechanical FPP blends of PP with linear low density polyethylene or very low density polyethylene plastomers;
polymerization FPP blends of PP blocks with PE blocks;
polyethylene plastomers or linear low density polyethylene obtained by copolymerization of ethylene with short-chain alpha-olefins with a density of less than 925 kg/m$^3$ (ISO 1183);
copolymer of ethylene with polar comonomers chosen from vinyl acetate, acrylic ester, acrylic acid, methacrylic acids, maleic anhydride, ionomers;
grafted copolymer of ethylene with acrylic acid, methacrylic acids, maleic anhydride (MAH), glycidyl methacrylate, hydroxyalkylacrylate;
or blends thereof.

39. The multi-layer backsheet according to claim 37, wherein all its layers are coextruded or colaminated.

40. The multi-layer backsheet according to claim 37, wherein all its layers are coextruded.

41. The multi-layer PV module backsheet of claim 1, further comprising at least one intermediate layer between the main layer and the at least one layer facing one or more cells, wherein the intermediate layer is based on polymerization FPP blends of PP blocks with PE blocks.

42. A backsheet according to claim 4, further comprising at least one intermediate compatibilizing layer, wherein the intermediate layer comprises a 3-layer reactive system of intermediate layers, wherein the first layer faces the main layer, and the last layer is or faces the functional PO layer.

43. A backsheet according to claim 9, wherein at least one intermediate FPP layer comprises VLDPE or Elastomer PP resin or a blend thereof.

44. The backsheet according to claim 1,
wherein the FPP is a mechanical blend of PP with a very low density polyethylene plastomer, being an olefin block copolymer of crystalline PE parts and amorphous copolymerized PE parts, wherein the TPO is a blend of linear low density polyethylene with a copolymer of ethylene and acrylic ester.

45. The backsheet according to claim 26,
wherein the FPP is a mechanical blend of PP with a very low density polyethylene plastomer, being an olefin block copolymer of crystalline PE parts and amorphous copolymerized PE parts, wherein the TPO is a blend of linear low density polyethylene with a copolymer of ethylene and acrylic ester.

46. The backsheet according to claim 37,
wherein the FPP is a mechanical blend of PP with a very low density polyethylene plastomer, being an olefin block copolymer of crystalline PE parts and amorphous copolymerized PE parts, wherein the TPO is a blend of linear low density polyethylene with a copolymer of ethylene and acrylic ester.

47. The multi-layer backsheet according to claim 26, wherein the FPP is a mechanical FPP blend of PP with linear low density polyethylene or very low density polyethylene plastomers, being selected from the group consisting of
olefin block copolymers of crystalline PE parts and amorphous copolymerized PE parts, polyethylene plastomers or linear low density polyethylene obtained by copolymerization of ethylene with short-chain alpha-olefins with a density of less than 925 kg/m³ (ISO 1183), copolymers of ethylene with polar comonomers chosen from vinyl acetate, acrylic ester, acrylic acid, methacrylic acids, ionomers.

48. The multi-layer backsheet according to claim 37, wherein the FPP is a mechanical FPP blend of PP with linear low density polyethylene or very low density polyethylene plastomers, being selected from the group consisting of olefin block copolymers of crystalline PE parts and amorphous copolymerized PE parts, polyethylene plastomers or linear low density polyethylene obtained by copolymerization of ethylene with short-chain alpha-olefins with a density of less than 925 kg/m³ (ISO 1183), copolymers of ethylene with polar comonomers chosen from vinyl acetate, acrylic ester, acrylic acid, methacrylic acids, ionomers.

49. A PV module according to claim 14, wherein the FPP is a mechanical FPP blend of PP with linear low density polyethylene or very low density polyethylene plastomers, wherein the linear low density polyethylene or very low density polyethylene plastomers are selected from the group consisting of:

olefin block copolymers of crystalline PE parts and amorphous copolymerized PE parts, polyethylene plastomers or linear low density polyethylene obtained by copolymerization of ethylene with short-chain alpha-olefins with a density of less than 925 kg/m³ (ISO 1183), and copolymers of ethylene with polar comonomers chosen from vinyl acetate, acrylic ester, acrylic acid, methacrylic acids, ionomers.

\* \* \* \* \*